(12) United States Patent
Takenaka et al.

(10) Patent No.: US 11,360,124 B2
(45) Date of Patent: Jun. 14, 2022

(54) CURRENT MEASURING DEVICE, CURRENT MEASURING METHOD, AND NON-TRANSITORY COMPUTER-READABLE STORAGE MEDIUM

(71) Applicant: Yokogawa Electric Corporation, Tokyo (JP)

(72) Inventors: Kazuma Takenaka, Tokyo (JP); Tetsuya Ishikawa, Tokyo (JP); Minako Terao, Tokyo (JP); Kotaro Ogawa, Tokyo (JP); Saki Kobako, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 16/971,927

(22) PCT Filed: Feb. 5, 2019

(86) PCT No.: PCT/JP2019/004009
§ 371 (c)(1),
(2) Date: Aug. 21, 2020

(87) PCT Pub. No.: WO2019/167565
PCT Pub. Date: Sep. 6, 2019

(65) Prior Publication Data
US 2021/0088557 A1  Mar. 25, 2021

(30) Foreign Application Priority Data

Mar. 1, 2018 (JP) .............................. JP2018-036472
Mar. 6, 2018 (JP) .............................. JP2018-039692

(51) Int. Cl.
*G01R 15/20* (2006.01)
*G01R 33/09* (2006.01)
*G01R 33/12* (2006.01)

(52) U.S. Cl.
CPC ......... *G01R 15/207* (2013.01); *G01R 33/093* (2013.01); *G01R 33/12* (2013.01)

(58) Field of Classification Search
CPC .... G01R 15/18; G01R 15/186; G01R 15/207; G01R 33/09; G01R 33/093; G01R 33/12; G01R 15/181; G01R 15/185; G01R 15/202; G01R 15/20; G01R 19/00;
(Continued)

(56) References Cited

U.S. PATENT DOCUMENTS 5,151,649 A     9/1992  Heroux
2011/0202295 A1  8/2011  Tamura et al.

FOREIGN PATENT DOCUMENTS

EP  0770887 A2   5/1997
JP  2005-55300 A  3/2005
JP  2007-179901 A 7/2007
(Continued)

*Primary Examiner* — Son T Le
(74) *Attorney, Agent, or Firm* — Rankin, Hill & Clark LLP

(57) ABSTRACT

A current measuring device (1) includes two triaxial magnetic sensors (11, 12) that are arranged with a prescribed gap between the two triaxial magnetic sensors (11, 12) such that magnetic-sensing directions of the two triaxial magnetic sensors (11, 12) are parallel to each other, and a calculator configured to calculate a current (I) flowing in a measurement-object conductor (MC) based on detection results from the two triaxial magnetic sensors (11, 12) and a gap between the two triaxial magnetic sensors (11, 12).

10 Claims, 12 Drawing Sheets

(58) Field of Classification Search
CPC .......................... G01R 19/0092; G01R 33/00; G01R 33/0029; G01R 19/02; G01R 33/06; G01R 1/22; G01B 7/00
See application file for complete search history.

(56) References Cited

FOREIGN PATENT DOCUMENTS

| | | |
|---|---|---|
| JP | 2007-183221 A | 7/2007 |
| JP | 2010-286295 A | 12/2010 |
| JP | 2011-164019 A | 8/2011 |
| KR | 10-1190926 | 10/2012 |

CURRENT MEASURING DEVICE, CURRENT MEASURING METHOD, AND NON-TRANSITORY COMPUTER-READABLE STORAGE MEDIUM

TECHNICAL FIELD

The present invention relates to a current measuring device, a current measuring method, and a non-transitory computer-readable storage medium.

BACKGROUND ART

In the related art, various types of current measuring devices that can directly measure a current flowing in a measurement-object conductor in a noncontact manner have been developed. Representative examples of such a current measuring device include a current transformer (CT) type current measuring device, a zero-flux type current measuring device, a Rogowski type current measuring device, and a Hall element type current measuring device.

For example, in CT type and zero-flux type current measuring devices, a current flowing in a measurement-object conductor is measured by providing a magnetic core on which a winding is wound in the vicinity of the measurement-object conductor and detecting a current flowing to cancel out a magnetic flux which is generated in the magnetic core due to a current flowing in the measurement-object conductor (a primary side). In the Rogowski type current measuring device, a current flowing in a measurement-object conductor is measured by providing a Rogowski coil (an air-core coil) in the vicinity of the measurement-object conductor and detecting a voltage which is caused in the Rogowski coil because a magnetic field generated due to an alternating current flowing in the measurement-object conductor is linked with the Rogowski coil.

In Patent Literature 1, an example of a zero-flux type current measuring device is disclosed. In Patent Literature 2, a current measuring device using a plurality of magnetic sensors is disclosed. Specifically, in the current measuring device disclosed in Patent Literature 2, two magnetic sensors are disposed with different distances from a measurement-object conductor, distances between the magnetic sensors and the measurement-object conductor are calculated from the outputs of the magnetic sensors, and a magnitude of a current flowing in the measurement-object conductor is calculated using the calculated distances.

CITATION LIST

Patent Literature

[Patent Literature 1]
Japanese Unexamined Patent Application, First Publication No. 2005-55300
[Patent Literature 2]
Japanese Unexamined Patent Application, First Publication No. 2011-164019

SUMMARY OF INVENTION

Technical Problem

Recently, in the process of development of hybrid vehicles (HV) and electric vehicles (EV), there has come to be demand for directly measuring a current flowing in pins of a power semiconductor such as SiC (silicon carbide) or a current flowing in a bus bar after being assembled. A pitch between pins of a power semiconductor is often small and a bus bar is often installed in a confined place. Accordingly, there is demand for a current measuring device that can be flexibly installed at the time of measurement of a current with respect to such a power semiconductor or a bus bar. In such hybrid vehicles or electric vehicles, for example, since a direct current supplied from a battery and an alternating current flowing in a motor are handled, there is demand for a current measuring device that can measure a direct current and an alternating current of a low frequency (for example, about 10 [Hz]) in a noncontact manner.

However, in the zero-flux type current measuring device disclosed in Patent Literature 1, since a magnetic core with a certain size needs to be provided in the vicinity of a measurement-object conductor, there is a problem in that it is difficult to install it in a small place. In the Rogowski type current measuring device, since a voltage which is caused in the Rogowski coil is detected, there is a problem in that a direct current cannot be measured in principle. In a low-frequency range, since an output signal is weak and a phase is uneven, there is a problem in that measurement accuracy is poor. In the current measuring device disclosed in Patent Literature 2, since a magnetic-sensing direction of a magnetic sensor needs to be aligned with a circumferential direction of a measurement-object conductor, there is a problem in that arrangement of the magnetic sensor is limited and flexible arrangement thereof is difficult.

Since a current flows generally out of a positive electrode of a power source and then flows into the negative electrode of the power source via a load or the like, a current path of a current which is supplied from the power source includes a path (an outward path) in which the current flows out of the positive electrode of the power source and a path (a return path) in which the current flows into the negative electrode of the power source. The former path may be referred to as a return path and the latter path may be referred to as an outward path. Accordingly, when a current flowing in one path of the current paths (for example, the outward path) is measured, there is a problem in that measurement accuracy degrades due to an influence of a magnetic field which is generated by a current flowing in the other path (for example, the return path) of the current paths.

The invention is made in consideration of the above-mentioned circumstances and an objective thereof is to provide a current measuring device, a current measuring method, and a non-transitory computer-readable storage medium that can be flexibly arranged and accurately measure a direct current and an alternating current of a low frequency in a noncontact manner.

Solution to Problem

In order to achieve the above-mentioned objective, a current measuring device according to an aspect of the invention is a current measuring device (1) that measures a current (I) flowing in a measurement-object conductor (MC), the current measuring device including: two triaxial magnetic sensors (11, 12) that are arranged with a prescribed gap between the two triaxial magnetic sensors such that magnetic-sensing directions of the two triaxial magnetic sensors are parallel to each other; and a calculator (24) configured to calculate the current flowing in the measurement-object conductor based on detection results from the two triaxial magnetic sensors and the gap (d) between the two triaxial magnetic sensors.

In the current measuring device according to the aspect of the invention, the calculator may include: a distance estimator (24b) configured to estimate a distance of one of the two triaxial magnetic sensors with respect to the measurement-object conductor based on the detection results from the two triaxial magnetic sensors and the gap between the two triaxial magnetic sensors; and a current calculator (24c) configured to calculate the current flowing in the measurement-object conductor based on the distance estimated by the distance estimator and the detection result from the one of the two triaxial magnetic sensors.

In the current measuring device according to the aspect of the invention, the calculator further may include a noise remover configured to remove noise components included in the detection results from the two triaxial magnetic sensors, and the calculator may be configured to calculate the current flowing in the measurement-object conductor using the detection results from the two triaxial magnetic sensors from which the noise components are removed by the noise remover.

In the current measuring device according to the aspect of the invention, the noise remover (24a) may be configured to remove the noise components included in the detection results from the two triaxial magnetic sensors by individually performing an averaging process or a square root of a sum of squares calculating process on the detection results from the two triaxial magnetic sensors which are acquired at prescribed constant time intervals.

The current measuring device according to the aspect of the invention may further include: a sensor head (10) including the two triaxial magnetic sensors; and a circuit unit (20) including the calculator.

In the current measuring device according to the aspect of the invention, signals indicating the detection results from the two triaxial magnetic sensors may be digital signals.

In order to achieve the above-mentioned objective, a current measuring method according to an aspect of the invention is a current measuring method which is performed by a current measuring device (1) that includes two triaxial magnetic sensors (11, 12) and a calculator (24) and measures a current (I) flowing in a measurement-object conductor (MC), the current measuring method including: calculating, by the calculator, the current flowing in the measurement-object conductor based on detection results from the two triaxial magnetic sensors that are arranged with a prescribed gap (d) between the two triaxial magnetic sensors such that magnetic-sensing directions of the two triaxial magnetic sensors are parallel to each other and the gap between the two triaxial magnetic sensors.

In the current measuring method according to the aspect of the invention, the calculator may include a distance estimator (24b) and a current calculator (24c), and the current measuring method may further includes: estimating, by the distance estimator, a distance of one of the two triaxial magnetic sensors with respect to the measurement-object conductor based on the detection results from the two triaxial magnetic sensors and the gap between the two triaxial magnetic sensors; and calculating, by the current calculator, the current flowing in the measurement-object conductor based on the distance estimated by the distance estimator and the detection result from the one of the two triaxial magnetic sensors.

In the current measuring method according to the aspect of the invention, the calculator may further include a noise remover (24a), and the current measuring method may further includes: removing, by the noise remover, noise components included in the detection results from the two triaxial magnetic sensors; and calculating, by the calculator, the current flowing in the measurement-object conductor based on the detection results from the two triaxial magnetic sensors from which the noise components are removed by the noise remover.

In order to achieve the above-mentioned objective, a non-transitory computer-readable storage medium according to an aspect of the invention is a non-transitory computer-readable storage medium storing one or more programs which are executed by a current measuring device (1) that includes two triaxial magnetic sensors (11, 12) and a calculator (24) and measures a current (I) flowing in a measurement-object conductor (MC), the one or more programs causing the current measuring device to execute: calculating, by the calculator, the current flowing in the measurement-object conductor based on detection results from two triaxial magnetic sensors that are arranged with a prescribed gap (d) between the two triaxial magnetic sensors such that magnetic-sensing directions of the two triaxial magnetic sensors are parallel to each other and the gap between the two triaxial magnetic sensors.

In order to achieve the above-mentioned objective, a current measuring device according to an aspect of the invention is a current measuring device (2) that measures a current (I) flowing in one of a pair of measurement-object conductors (MC1, MC2) in which currents flow in opposite directions, the current measuring device including: three triaxial magnetic sensors (31, 32, 33) that are arranged with a prescribed positional relationship such that magnetic-sensing directions of the three triaxial magnetic sensors are parallel to each other; and a calculator (45) configured to exclude an influence of a magnetic field which is generated due to a current flowing in another measurement-object conductor based on detection results from the three triaxial magnetic sensors and the positional relationship between the three triaxial magnetic sensors and to calculate the current flowing in the one of the measurement-object conductors.

In the current measuring device according to the aspect of the invention, the calculator may include: a magnetic field estimator (45b) configured to estimate a magnetic field which is generated due to a current flowing in the other measurement-object conductor based on the detection results from the three triaxial magnetic sensors and the positional relationship between the three triaxial magnetic sensors; a distance estimator (45c) configured to estimate a distance of at least one of the three triaxial magnetic sensors with respect to the one of the measurement-object conductors based on the detection results from the three triaxial magnetic sensors and the positional relationship between the three triaxial magnetic sensors; and a current calculator (45d) configured to calculate the current flowing in the one of the measurement-object conductors based on the distance estimated by the distance estimator and a value which is obtained by subtracting a magnetic field estimated by the magnetic field estimator from the detection results from the three triaxial magnetic sensors of which the distance is estimated by the distance estimator.

In the current measuring device according to the aspect of the invention, the magnetic field estimated by the magnetic field estimator may be a magnetic field when a magnetic field which is generated due to a current flowing in the other measurement-object conductor acts approximately uniformly on the three triaxial magnetic sensors.

In the current measuring device according to the aspect of the invention, the calculator may further include a noise remover (45a) configured to remove noise components included in the detection results from the three triaxial magnetic sensors, and the calculator may be configured to calculate the current flowing in the one of the measurement-object conductors using the detection results from the three triaxial magnetic sensors from which the noise components are removed by the noise remover.

In the current measuring device according to the aspect of the invention, the noise remover may be configured to remove the noise components included in the detection results from the three triaxial magnetic sensors by individually performing an averaging process or a square root of a sum of squares calculating process on the detection results from the three triaxial magnetic sensors which are acquired at prescribed constant time intervals.

The current measuring device according to the aspect of the invention may further include: a sensor head (30) including the three triaxial magnetic sensors; and a circuit unit (40) including the calculator.

In the current measuring device according to the aspect of the invention, signals indicating the detection results from the three triaxial magnetic sensors may be digital signals.

In order to achieve the above-mentioned objective, a current measuring method according to an aspect of the invention is a current measuring method that is performed by a current measuring device (2) that includes three triaxial magnetic sensors (31, 32, 33) and a calculator (45) and measures a current (I) flowing in one of a pair of measurement-object conductors (MC1, MC2) in which currents flow in opposite directions, the current measuring method causing the current measuring device to execute: excluding, by the calculator, an influence of a magnetic field which is generated due to a current flowing in another measurement-object conductor based on detection results from three triaxial magnetic sensors that are arranged with a prescribed positional relationship such that magnetic-sensing directions of the three triaxial magnetic sensors are parallel to each other and a positional relationship between the three triaxial magnetic sensors and then calculating the current flowing in the one of the measurement-object conductors.

In the current measuring method according to the aspect of the invention, the calculator may include a magnetic field estimator (45b), a distance estimator (45c), and a current calculator (45d), and the current measuring method may further includes: estimating, by the magnetic field estimator, a magnetic field which is generated due to a current flowing in the other measurement-object conductor based on the detection results from the three triaxial magnetic sensors and the positional relationship between the three triaxial magnetic sensors; estimating, by the distance estimator, a distance of at least one of the three triaxial magnetic sensors with respect to the one of the measurement-object conductors based on the detection results from the three triaxial magnetic sensors and the positional relationship between the three triaxial magnetic sensors; and calculating, by the current calculator, the current flowing in the one of the measurement-object conductors based on the distance estimated by the distance estimator and a value which is obtained by subtracting a magnetic field estimated by the magnetic field estimator from the detection results from the three triaxial magnetic sensors of which the distance is estimated by the distance estimator.

In order to achieve the above-mentioned objective, a non-transitory computer-readable storage medium according to an aspect of the invention is a non-transitory computer-readable storage medium storing one or more programs which are executed by a current measuring device (2) that includes three triaxial magnetic sensors (31, 32, 33) and a calculator (45) and measures a current (I) flowing in one of a pair of measurement-object conductors (MC1, MC2) in which currents flow in opposite directions, the one or more programs causing the current measuring device to execute: excluding an influence of a magnetic field which is generated due to a current flowing in the other of the measurement-object conductors based on detection results from three triaxial magnetic sensors that are arranged with a prescribed positional relationship such that magnetic-sensing directions of the three triaxial magnetic sensors are parallel to each other and a positional relationship between the three triaxial magnetic sensors and then calculating the current flowing in the one of the measurement-object conductors.

Advantageous Effects of Invention

According to the invention, it is possible to flexibly arrange the current measuring device and to accurately measure a direct current and an alternating current of a low frequency in a noncontact manner.

DESCRIPTION OF EMBODIMENTS

First Embodiment

Hereinafter, a current measuring device according to a first embodiment of the present invention will be described in detail with reference to the accompanying drawings.

<Configuration of Current Measuring Device>

Figure 1:
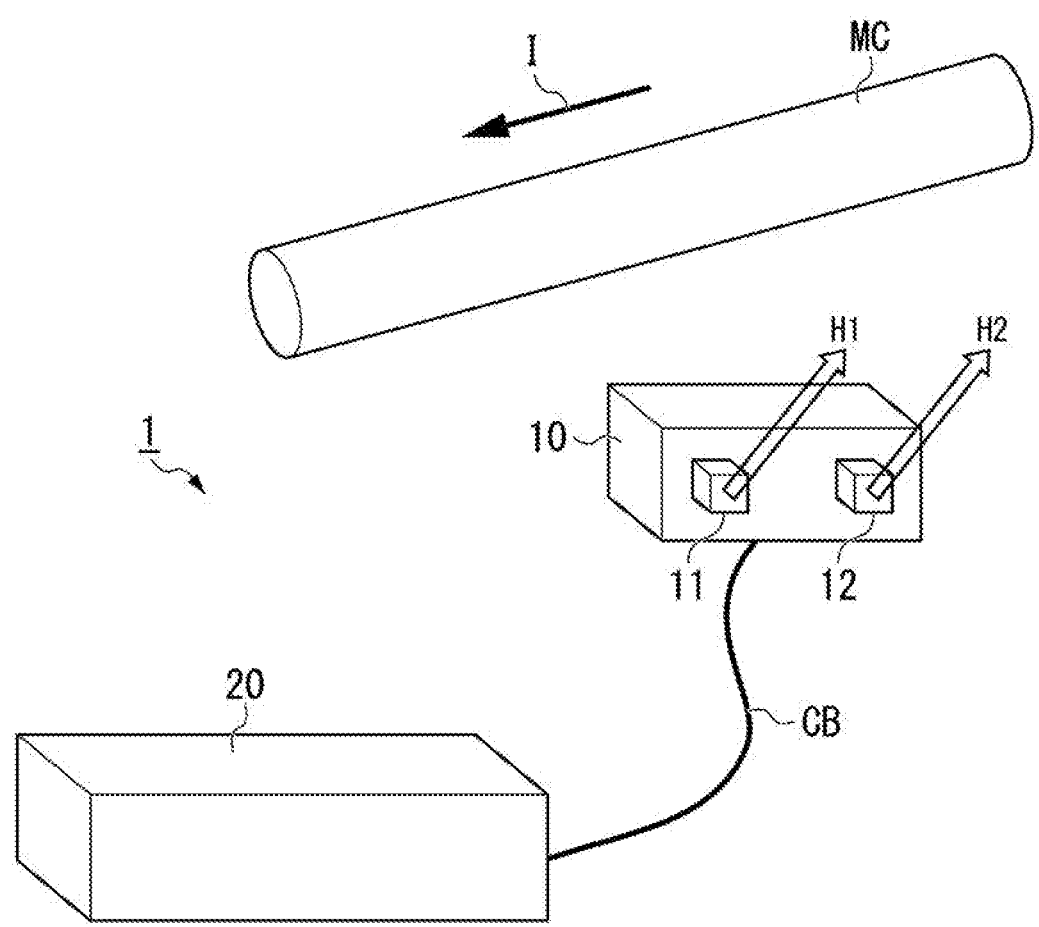
FIG. 1 is a diagram schematically illustrating a current measuring device according to a first embodiment.

FIG. 1 is a diagram schematically illustrating a current measuring device according to a first embodiment. As illustrated in FIG. 1, a current measuring device 1 according to the first embodiment includes a sensor head 10 and a circuit unit 20 which are connected to each other by a cable CB, and directly measures a current I flowing in a measurement-object conductor MC in a noncontact manner. The measurement-object conductor MC is an arbitrary conductor such as a pin of a power semiconductor or a bus bar. In the following description, for the purpose of simplification of description, the measurement-object conductor MC is assumed to be a conductor of a cylindrical shape.

The sensor head 10 is a member that is disposed in an arbitrary posture at an arbitrary position relative to a measurement-object conductor MC in order to measure a current I flowing in the measurement-object conductor MC in a noncontact manner. The sensor head 10 is formed of a material (such as a resin) which does not intercept a magnetic field which is generated by a current I (for example, magnetic fields H1 and H2 in FIG. 1). In other words, the sensor head 10 is used as a probe for measuring the current I flowing in the measurement-object conductor MC in a noncontact manner.

Two triaxial magnetic sensors 11 and 12 are provided in the sensor head 10. The triaxial magnetic sensors 11 and 12 are magnetic sensors having magnetic-sensing directions in three axes which are perpendicular to each other. The triaxial magnetic sensors 11 and 12 are arranged with a prescribed gap between the triaxial magnetic sensors 11 and 12 such that the magnetic-sensing directions of the triaxial magnetic sensors 11 and 12 are parallel to each other. For example, first axes of the triaxial magnetic sensors 11 and 12 are parallel to each other, second axes of the triaxial magnetic sensors 11 and 12 are parallel to each other, third axes of the triaxial magnetic sensors 11 and 12 are parallel to each other, and the triaxial magnetic sensors 11 and 12 are arranged apart from each other a predetermined distance in a predetermined direction. In the following description, it is assumed that the triaxial magnetic sensors 11 and 12 are arranged apart a predetermined distance in the first axis direction.

Signals indicating the detection results from the triaxial magnetic sensors 11 and 12 may be any of analog signals and digital signals. When the signals indicating the detection results from the triaxial magnetic sensors 11 and 12 are digital signals, the number of cables CB connecting the sensor head 10 and the circuit unit 20 can be decreased. For example, when the signals indicating the detection results from the triaxial magnetic sensors 11 and 12 are analog signals, three cables CB for outputting the detection results of three axes from the triaxial magnetic sensors 11 and 12 are required and thus a total of six cables CB are required. However, when the signals indicating the detection results from the triaxial magnetic sensors 11 and 12 are digital signals, only one cable CB is required. When the number of cables CB is small, flexibility of the cables CB is improved and thus the cables can be easily handled, for example, when the sensor head 10 is provided in a small space.

The circuit unit 20 measures a current I flowing in a measurement-object conductor MC based on the detection results (the detection results from the triaxial magnetic sensors 11 and 12) output from the sensor head 10. The circuit unit 20 displays the results of measurement of the current I or outputs the results of measurement to the outside. An arbitrary cable can be used as the cable CB connecting the sensor head 10 and the circuit unit 20, and a cable having flexibility, easiness in handling, and difficulty in disconnection can be preferably employed.

Figure 2:
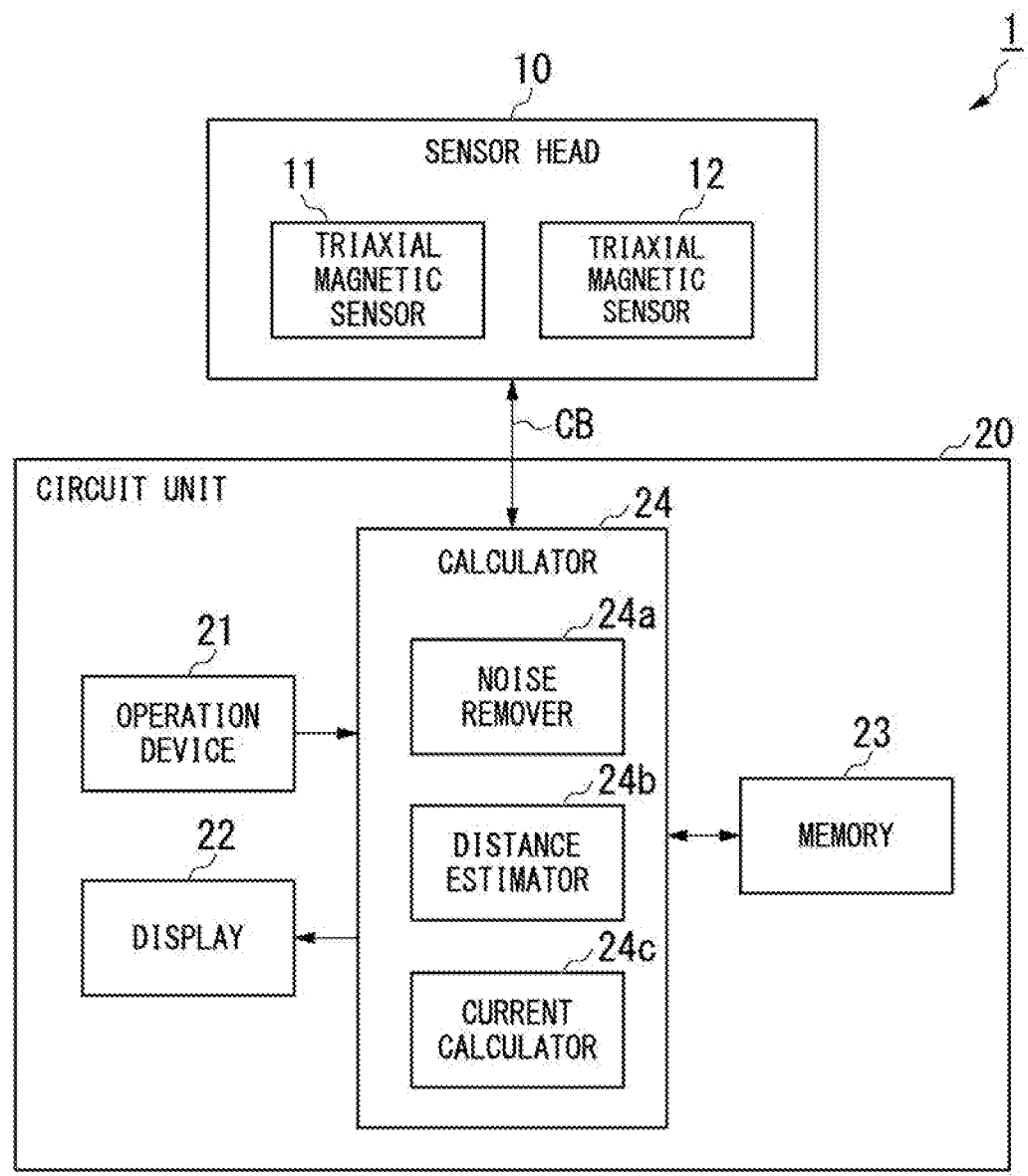
FIG. 2 is a block diagram illustrating a configuration of a principal part of the current measuring device according to the first embodiment.

FIG. 2 is a block diagram illustrating a configuration of a principal part of the current measuring device according to the first embodiment. In FIG. 2, blocks corresponding to the configuration illustrated in FIG. 1 will be referred to by the same reference signs. Details of the inner configuration of the circuit unit 20 will be mainly described below with reference to FIG. 2. As illustrated in FIG. 2, the circuit unit 20 includes an operation device 21, a display 22, a memory 23, and a calculator 24.

The operation device 21 includes various buttons such as a power supply button and a setting button and outputs signals indicating operation instructions for the buttons to the calculator 24. The display 22 includes a display device such as a 7-segment light emitting diode (LED) indicator or a liquid crystal display device and displays various types of information (for example, information indicating the result of measurement of the current I) output from the calculator 24. The operation device 21 and the display 22 may be physically separated from each other or may be physically integrated as in a touch panel type liquid crystal display device having both a display function and an operation function.

The memory 23 includes, for example, a volatile or nonvolatile semiconductor memory and stores the detection results from the triaxial magnetic sensors 11 and 12 output from the sensor head 10, the results of calculation from the calculator 24 (the result of measurement of the current I), and the like. The memory 23 may include an auxiliary storage device such as a hard disk drive (HDD) or a solid state drive (SSD) in addition to the semiconductor memory (or instead of the semiconductor memory).

The calculator 24 is realized, for example, by causing a hardware processor such as a central processing unit (CPU) to execute a program (software). Some or all of elements of the calculator 24 may be realized in hardware such as a large scale integration (LSI), an application-specific integrated circuit (ASIC), or a field-programmable gate array (FPGA) or may be realized in cooperation of software and hardware. The calculator 24 stores the detection results from the triaxial magnetic sensors 11 and 12 output from the sensor head 10 in the memory 23. The calculator 24 reads the detection results from the triaxial magnetic sensors 11 and 12 stored in the memory 23 and performs an operation of calculating the current I flowing in the measurement-object conductor MC. The calculator 24 includes a noise remover 24a, a distance estimator 24b, and a current calculator 24c.

The noise remover 24a removes noise components included in the detection results from the triaxial magnetic sensors 11 and 12. Specifically, the noise remover 24a removes noise components included in the detection results from the triaxial magnetic sensors 11 and 12 by individually performing an averaging process or a square root of a sum of squares calculating process on a plurality of detection results acquired from the triaxial magnetic sensors 11 and 12 at prescribed constant time intervals (for example, 1 second). The detection results of three axes are output from the triaxial magnetic sensors 11 and 12, and removal of noise components by the noise remover 24a is individually performed on the detection result of each axis. This removal of noise is for improving a signal-to-noise (SN) ratio of the triaxial magnetic sensors 11 and 12 and enhancing measurement accuracy of the current I.

The distance estimator 24b estimates a distance of one of the triaxial magnetic sensors 11 and 12 with respect to the measurement-object conductor MC based on the detection results from the triaxial magnetic sensors 11 and 12 and the gap between the triaxial magnetic sensors 11 and 12. In the first embodiment, it is assumed that the distance estimator 24b estimates the distance of the triaxial magnetic sensor 12 with respect to the measurement-object conductor MC. This estimation of a distance is for measuring the current I flowing in the measurement-object conductor MC. Details of the process which is performed by the distance estimator 24b will be described later.

The current calculator 24c calculates the current I flowing in the measurement-object conductor MC based on the distance estimated by the distance estimator 24b and the detection result from one of the triaxial magnetic sensors 11 and 12. In the first embodiment, it is assumed that the current calculator 24c calculates the current I flowing in the measurement-object conductor MC based on the distance estimated by the distance estimator 24b and the result of the detection from the triaxial magnetic sensor 12 of which the distance with respect to the measurement-object conductor MC is estimated. Details of the process which is performed by the current calculator 24c will be described later.

As illustrated in FIGS. 1 and 2, the circuit unit 20 is separated from the sensor head 10 and is connected to the sensor head 10 via the cable CB. By employing this configuration, a magnetic field detecting function (the triaxial magnetic sensors 11 and 12) and a calculation function (the calculator 24) can be separated from each other, various problems (for example, temperature characteristics and insulation resistance) which occur when the calculator 24 is provided in the sensor head 10 can be avoided, and thus the usage of the current measuring device 1 can be expanded.

<Principle of Measuring Current>

Figure 3:
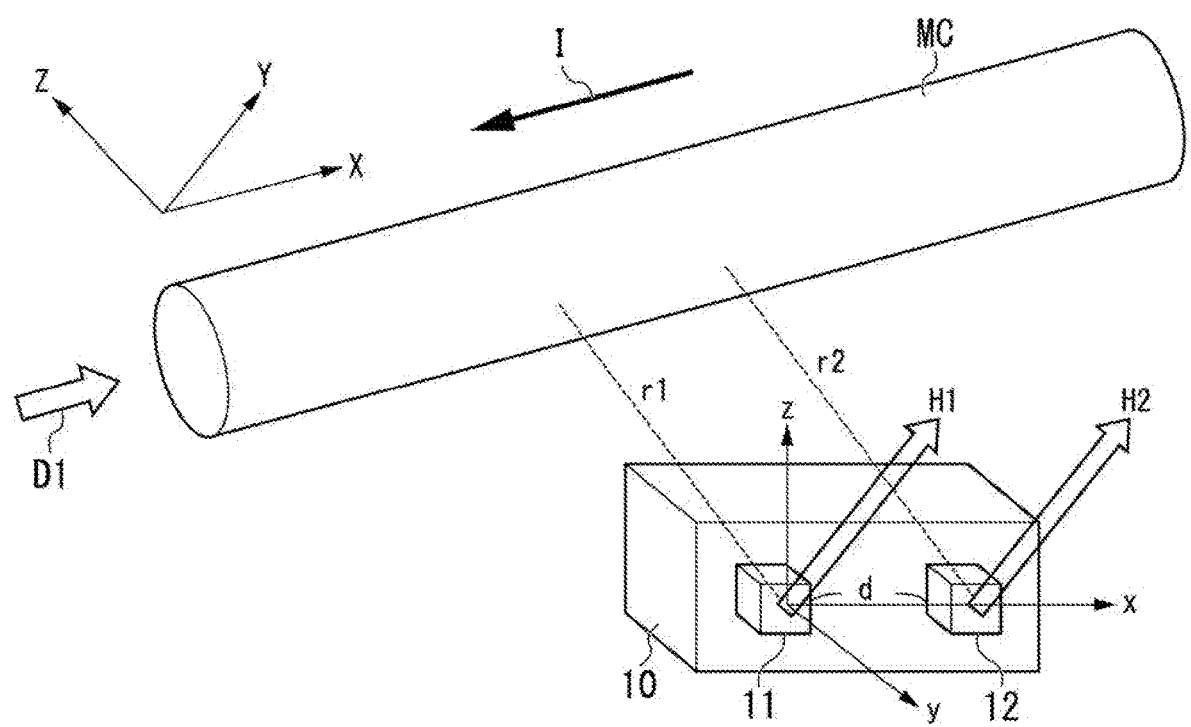
FIG. 3 is a diagram illustrating the principle of measuring a current using the current measuring device according to the first embodiment.

The principle of measuring a current in the current measuring device 1 will be described below. FIG. 3 is a diagram illustrating the principle of measuring a current using the current measuring device according to the first embodiment. First, as illustrated in FIG. 3, two coordinate systems including a coordinate system (an xyz orthogonal coordinate system) associated with only the sensor head 10 and a coordinate system (an XYZ orthogonal coordinate system) associated with both the measurement-object conductor MC and the sensor head 10 are set. For the purpose of easy illustration, the XYZ orthogonal coordinate system is illustrated with a deviating origin position, but the origin of the XYZ orthogonal coordinate system may be the same position as the origin of the xyz orthogonal coordinate system.

The xyz orthogonal coordinate system is a coordinate system which is defined depending on the position and posture of the sensor head 10. In the xyz orthogonal coordinate system, the origin is set to the position of the triaxial magnetic sensor 11, the x axis is set to the arrangement direction (the first axis direction) of the triaxial magnetic sensors 11 and 12, the y axis is set to the second axis direction of the triaxial magnetic sensors 11 and 12, and the z axis is set to the third axis direction of the triaxial magnetic sensors 11 and 12. It is assumed that the gap in the x direction between the triaxial magnetic sensors 11 and 12 is d [m]. Accordingly, the triaxial magnetic sensor 11 is disposed at coordinates (0, 0, 0) in the xyz orthogonal coordinate system and the triaxial magnetic sensor 12 is disposed at coordinates (d, 0, 0) in the xyz orthogonal coordinate system.

The XYZ orthogonal coordinate system is a coordinate system which is defined depending on a relative positional relationship between the measurement-object conductor MC and the sensor head 10. In the XYZ orthogonal coordinate system, the origin is set to the position of the triaxial magnetic sensor 11, the X axis is set to be parallel to the length direction of the measurement-object conductor MC (the direction of the current I), and the Y axis is set to be parallel to the direction of the magnetic field H1 at the origin position (the position of the triaxial magnetic sensor 11). The Z axis is set to be perpendicular to the X axis and the Y axis.

As illustrated in FIG. 3, the distance of the triaxial magnetic sensor 11 with respect to the measurement-object conductor MC is defined as r1 and the distance of the triaxial magnetic sensor 12 with respect to the measurement-object conductor MC is defined as r2. The distance r1 is a length of a segment which is drawn perpendicularly from the triaxial magnetic sensor 11 to the measurement-object conductor MC, and the distance r2 is a length of a segment which is drawn perpendicularly from the triaxial magnetic sensor 12 to the measurement-object conductor MC. The magnetic field which is formed at the position of the triaxial magnetic sensor 11 by the current I is defined as H1 and the magnetic field which is formed at the position of the triaxial magnetic sensor 12 by the current I is defined as H2. The magnetic fields H1 and H2 can be detected by the triaxial magnetic sensors 11 and 12, but the distances r1 and r2 cannot be detected from only the magnetic fields H1 and H2.

Figure 4:
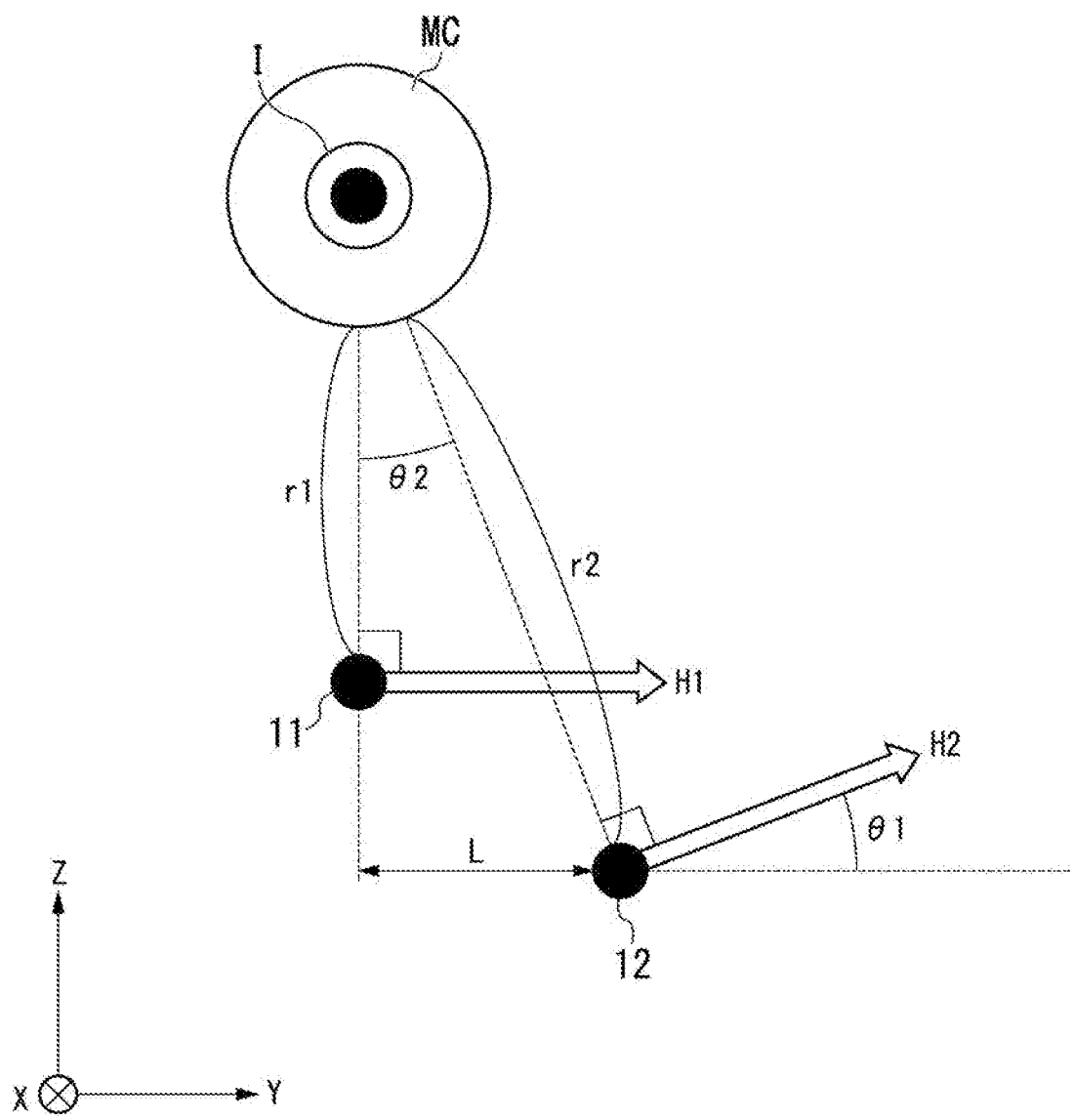
FIG. 4 is a diagram illustrating a measurement-object conductor and triaxial magnetic sensors in the first embodiment when seen from a direction D1 in FIG. 3.

FIG. 4 is a diagram illustrating the measurement-object conductor and the triaxial magnetic sensors when seen in a direction D1 in FIG. 3. The direction D1 in FIG. 3 is a direction (the direction antiparallel to the flowing direction of the current I) which is parallel to the length direction of the measurement-object conductor MC. In FIG. 4, for the purpose of easy understanding, the sensor head 10 is not illustrated and the measurement-object conductor MC and the triaxial magnetic sensors 11 and 12 are illustrated. In FIG. 4, similarly to FIG. 3, the XYZ orthogonal coordinate system with a deviating origin position is illustrated.

As illustrated in FIG. 4, the magnetic fields H1 and H2 which are formed at the positions of the triaxial magnetic sensors 11 and 12 by the current I flowing in the X direction (–X direction) perpendicular to the drawing surface are perpendicular to the X axis. Accordingly, as illustrated in FIG. 4, the magnetic fields H1 and H2 which are formed at the positions of the triaxial magnetic sensors 11 and 12 can be projected onto the YZ plane perpendicular to the direction in which the current I flows without changing the magnitudes thereof.

The magnetic field H1 which is formed at the position of the triaxial magnetic sensor 11 is perpendicular to a segment which is drawn perpendicularly from the triaxial magnetic sensor 11 to the measurement-object conductor MC. The magnetic field H2 which is formed at the position of the triaxial magnetic sensor 12 is perpendicular to a segment which is drawn perpendicularly from the triaxial magnetic sensor 12 to the measurement-object conductor MC. Accordingly, an angle $\theta 2$ which is formed by the segments is the same as an angle $\theta 1$ which is formed by the magnetic field H1 and the magnetic field H2. Accordingly, the gap L in the Y direction between the triaxial magnetic sensors 11 and 12 is represented by Expression (1).

[Math. 1]

$$L = r2 \cdot \sin \theta 1 \quad (1)$$

As described above, the angle $\theta 1$ is an angle which is formed by the magnetic field H1 and the magnetic field H2 which are expressed as vectors. Accordingly, the angle $\theta 1$ is represented by Expression (2) using an inner product formula of vectors.

[Math. 2]

$$H1 \cdot H2 = |H1||H2| \cos \theta 1 \quad (2)$$

Expression (3) is obtained by modifying Expression (2) and substituting the modified Expression (2) into Expression (1).

[Math. 3]

$$r2 = \frac{L}{\sin \theta 1} = \frac{L}{\sqrt{1 - \left(\frac{H1 \cdot H2}{|H1||H2|}\right)^2}} \quad (3)$$

The magnetic fields H1 and H2 in Expression (3) are the detection results from the triaxial magnetic sensors 11 and 12. Accordingly, the distance r2 of the triaxial magnetic sensor 12 with respect to the measurement-object conductor MC can be calculated (estimated) when the gap L is known. When the distance r2 can be calculated (estimated), the current I can be measured based on Ampere's law using the distance r2 and the magnetic field H2 which is detected by the triaxial magnetic sensor 12. A method of calculating the gap L in the Y direction between the triaxial magnetic sensors 11 and 12 which is required for calculating the distance r2 (a distance required for measuring the current I) will be described below.

Figure 5A:
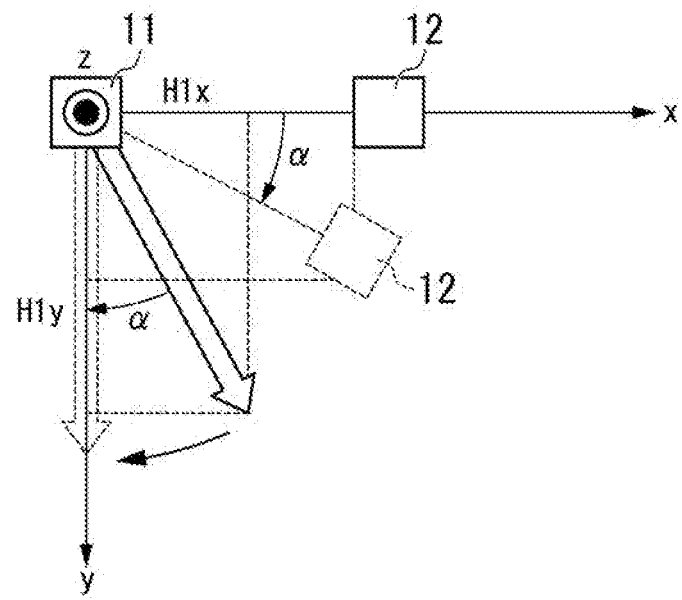
FIG. 5A is a diagram illustrating a method of calculating a gap L in a Y direction between the triaxial magnetic sensors in the first embodiment.
Figure 5B:
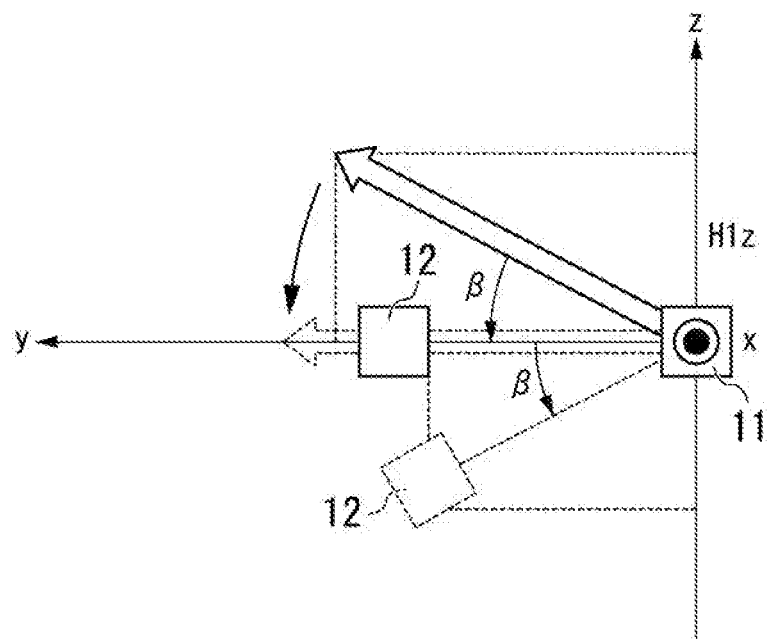
FIG. 5B is a diagram illustrating a method of calculating the gap L in the Y direction between the triaxial magnetic sensors in the first embodiment.
Figure 5C:
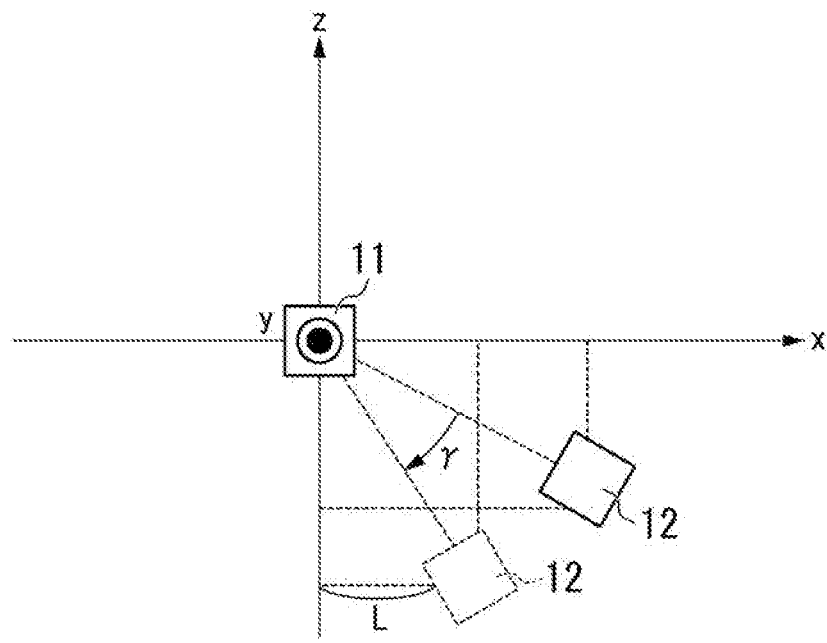
FIG. 5C is a diagram illustrating a method of calculating the gap L in the Y direction between the triaxial magnetic sensors in the first embodiment.

FIGS. 5A to 5C are diagrams illustrating the method of calculating the gap L in the Y direction between the triaxial magnetic sensors. FIG. 5A is a view of the xyz coordinate system when seen from the +z side to the −z side, FIG. 5B is a view of the xyz coordinate system when seen from the +x side to the −x side, and FIG. 5C is a view of the xyz coordinate system when seen from the +y side to the −y side. In the first embodiment, an operation of rotating the XYZ coordinate system to be aligned with the xyz coordinate system is performed and the gap L in the Y direction between the triaxial magnetic sensors 11 and 12 is calculated. By performing this operation, the magnetic field at the position of the triaxial magnetic sensor 1 has only a y component and the measurement-object conductor MC falls into a state in which it is perpendicular to the yz plane (a state in which it is parallel to the x axis).

Specifically, first, an operation of rotating the XYZ coordinate system around the z axis by an angle α and disposing the magnetic field H1 (the Y axis) on the yz plane is performed as illustrated in FIG. 5A. Here, when the x component of the magnetic field H1 detected by the triaxial magnetic sensor 11 is defined as $H1_x$, the y component thereof is defined as $H1_y$, and the z component thereof is defined as H1z, the angle α is represented by Expression (4). The position P1 of the triaxial magnetic sensor 12 after this operation has been performed is represented by Expression (5).

[Math. 4]

$$\cos \alpha = \frac{H1_y}{\sqrt{H1_x^2 + H1_y^2}} \quad (4)$$

$$\sin \alpha = \frac{H1_x}{\sqrt{H1_x^2 + H1_y^2}}$$

-continued

[Math. 5]

$$P1 = (d \cos \alpha, d \sin \alpha, 0) \quad (5)$$

Then, an operation of rotating the XYZ coordinate system around the x axis by an angle β and disposing the magnetic field H1 (the Y axis) on the y axis is performed as illustrated in FIG. 5B. The angle βα is represented by Expression (6). The position P2 of the triaxial magnetic sensor 12 after this operation has been performed is represented by Expression (7).

[Math. 6]

$$\cos \beta = \frac{\sqrt{H1_x^2 + H1_y^2}}{|H1|} \quad (6)$$

$$\sin \beta = \frac{H1_z}{|H1|}$$

[Math. 7]

$$P2 = (d \cos \alpha, d \sin \alpha \cos \beta, d \sin \alpha \sin \beta) \quad (7)$$

Subsequently, an operation of rotating the XYZ coordinate system around the y axis by an angle γ such that the measurement-object conductor MC becomes perpendicular to the yz plane is performed as illustrated in FIG. 5C. At this time, since the y coordinate does not change, the y coordinate of the position P3 of the triaxial magnetic sensor 12 after this operation has been performed is d·sin α·cos β.

By performing this operation, the gap L in the Y direction (the y direction) between the triaxial magnetic sensors 11 and 12 becomes equal to the y coordinate (d·sin α·cos β) of the position P3 of the triaxial magnetic sensor 12. Then, Expression (1) can be modified to Expression (8) using Expression (4) and Expression (6). Referring to Expression (8), it can be seen that the distance r2 of the triaxial magnetic sensor 12 with respect to the measurement-object conductor MC is calculated (estimated) from the detection results from the triaxial magnetic sensors 11 and 12 and the gap d between the triaxial magnetic sensors 11 and 12.

[Math. 8]

$$r2 = d \times \frac{H1_x}{|H1|} \times \frac{1}{\sqrt{1 - \left(\frac{H1 \cdot H2}{|H1||H2|}\right)^2}} \quad (8)$$

When the distance r2 of the triaxial magnetic sensor 12 with respect to the measurement-object conductor MC is acquired, the current I flowing in the measurement-object conductor MC can be calculated using Ampere's law. Specifically, the current I can be calculated by Expression (9). Referring to Expression (9), it can be seen that the current I is calculated from a constant (2π), the distance r2, and the detection result (H2) from the triaxial magnetic sensor 12.

[Math. 9]

$$I = 2\pi r2 |H2| = 2\pi \times d \times \frac{H1_x}{|H1|} \times \frac{1}{\sqrt{1 - \left(\frac{H1 \cdot H2}{|H1||H2|}\right)^2}} \times |H2| \quad (9)$$

<Operation of Current Measuring Device>

An operation when the current I flowing in the measurement-object conductor MC is measured using the current measuring device 1 will be described below. First, a user of the current measuring device 1 disposes the sensor head 10 close to the measurement-object conductor MC in order to measure the current I flowing in the measurement-object conductor MC. The position and the posture of the sensor head 10 with respect to the measurement-object conductor MC are arbitrary.

Figure 6:
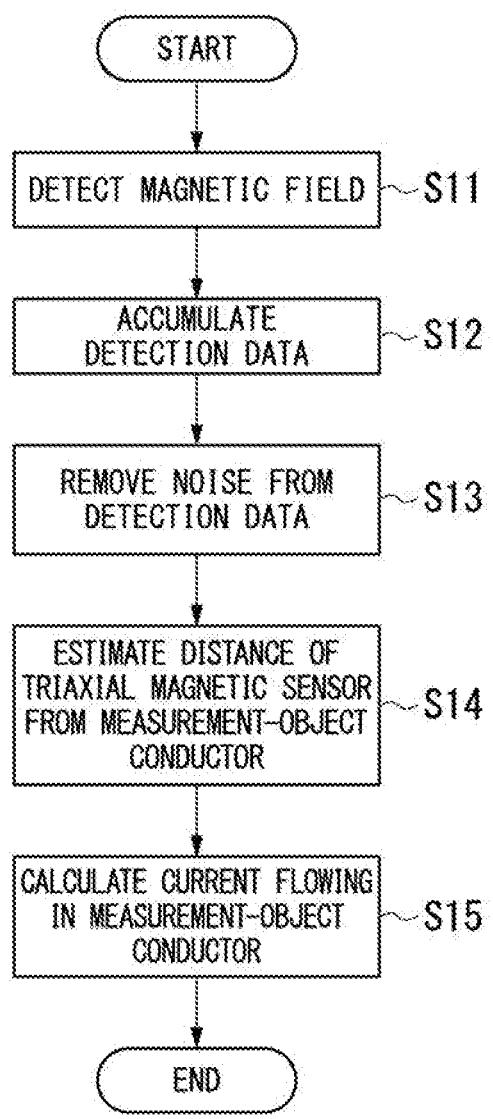
FIG. 6 is a flowchart illustrating a flow of operations of the current measuring device according to the first embodiment.

FIG. 6 is a flowchart illustrating the outline of the operation of the current measuring device according to the first embodiment. The flowchart illustrated in FIG. 6 is started, for example, at constant time intervals (for example, 1 second). When the process flow of the flowchart illustrated in FIG. 6 is started, the triaxial magnetic sensors 11 and 12 detects magnetic fields which are formed by the current I flowing in the measurement-object conductor MC (Step S11). The triaxial magnetic sensors 11 and 12 detect the magnetic fields, for example, 1000 times per second. Then, the calculator 24 of the circuit unit 20 accumulates detection data indicating the detection results from the triaxial magnetic sensors 11 and 12 in the memory 23 (Step S12).

Subsequently, the noise remover 24a removes noise components from the detection data (Step S13). Specifically, the noise remover 24a removes the noise components included in the detection data by reading the detection data accumulated in the memory 23 and performing an averaging process or a square root of a sum of squares calculating process on the read detection data. When signs disappear by performing the square root of a sum of squares calculating process, the noise remover 24a separately adds signs to the detection data. Here, each of the triaxial magnetic sensors 11 and 12 outputs three types of detection data indicating the detection results of three axes. The noise remover 24a individually performs the removal of noise components on the detection data of each axis.

Subsequently, the distance estimator 24b estimates the distance r2 of the triaxial magnetic sensor 12 with respect to the measurement-object conductor MC (Step S14). Specifically, the distance estimator 24b estimates the distance r2 of the triaxial magnetic sensor 12 with respect to the measurement-object conductor MC by performing the calculation represented by Expression (8) using the detection data from which noise has been removed in Step S13 and data indicating the gap d between the triaxial magnetic sensors 11 and 12 which is input in advance.

When the above-mentioned process flow ends, the current calculator 24c of the calculator 24 calculates the current I flowing in the measurement-object conductor MC (Step S15). Specifically, the current calculator 24c of the calculator 24 calculates the current I flowing in the measurement-object conductor MC by performing the calculation represented by Expression (9) using the distance r2 estimated in Step S14 and the detection data of the triaxial magnetic sensor 12 from which noise has been removed in Step S13. In this way, the current measuring device 1 directly measures the current I flowing in the measurement-object conductor MC in a noncontact manner.

As described above, the current measuring device 1 according to the first embodiment estimates the distance r2 of the triaxial magnetic sensor 12 with respect to the measurement-object conductor MC using the detection data indicating the detection results from the triaxial magnetic sensors 11 and 12 and data indicating the gap d between the triaxial magnetic sensors 11 and 12. The current measuring device 1 measures the current I flowing in the measurement-object conductor MC using the estimated distance r2 and the detection data indicating the detection result from the triaxial magnetic sensor 12. In the first embodiment, the position and the posture of the sensor head 10 with respect to the measurement-object conductor MC may be arbitrary. The detection results from the triaxial magnetic sensors 11 and 12 are acquired regardless of whether the current I is a direct current or an alternating current. Accordingly, the current measuring device 1 according to the first embodiment can be flexibly disposed and directly measure a direct current and an alternating current of a low frequency in a noncontact manner.

In the first embodiment, the sensor head 10 in which the triaxial magnetic sensors 11 and 12 are provided and the circuit unit 20 in which the calculator 24 is provided are separated from each other and are connected by the cable CB. Accordingly, since the sensor head 10 can be easily handled and the sensor head 10 can be easily installed, for example, in a small place, it is possible to more flexibly dispose the current measuring device 1.

While the current measuring device according to the first embodiment has been described above, the invention is not limited to the first embodiment and can be freely modified within the scope of the invention. For example, in the first embodiment, the current measuring device 1 estimates the distance r2 of the triaxial magnetic sensor 12 with respect to the measurement-object conductor MC and measures the current I flowing in the measurement-object conductor MC using the estimated distance r2. However, referring to Expression (9), it can be seen that the current I flowing in the measurement-object conductor MC is calculated from the detection results from the triaxial magnetic sensors 11 and 12 and the gap d between the triaxial magnetic sensors 11 and 12. Accordingly, the current measuring device 1 may directly measure the current I flowing in the measurement-object conductor MC using Expression (9) without estimating the distance r2 of the triaxial magnetic sensor 12 with respect to the measurement-object conductor MC.

In the first embodiment, the current measuring device 1 estimates only the distance r2 of the triaxial magnetic sensor 12 with respect to the measurement-object conductor MC and measures the current I flowing in the measurement-object conductor MC using the estimated distance r2. However, the current measuring device 1 may estimate both the distances r1 and r2 of the triaxial magnetic sensors 11 and 12 with respect to the measurement-object conductor MC and measure the current I flowing in the measurement-object conductor MC by calculating the current I flowing in the measurement-object conductor MC using the estimated distance r1, calculating the current I flowing in the measurement-object conductor MC using the estimated distance r2, and averaging the calculated currents I.

In the first embodiment, the triaxial magnetic sensors 11 and 12 are separated the gap d [m] in the first axis direction (the x axis direction) from each other. However, the triaxial magnetic sensors 11 and 12 may be separated in the second axis direction (the y axis direction), may be separated in the third axis direction (the z axis direction), or may be separated in any other direction. That is, the direction in which the triaxial magnetic sensors 11 and 12 are separated from each other is arbitrary.

Second Embodiment

Hereinafter, a current measuring device according to a second embodiment of the present invention will be described in detail with reference to the accompanying drawings.

<Configuration of Current Measuring Device>

Figure 7:
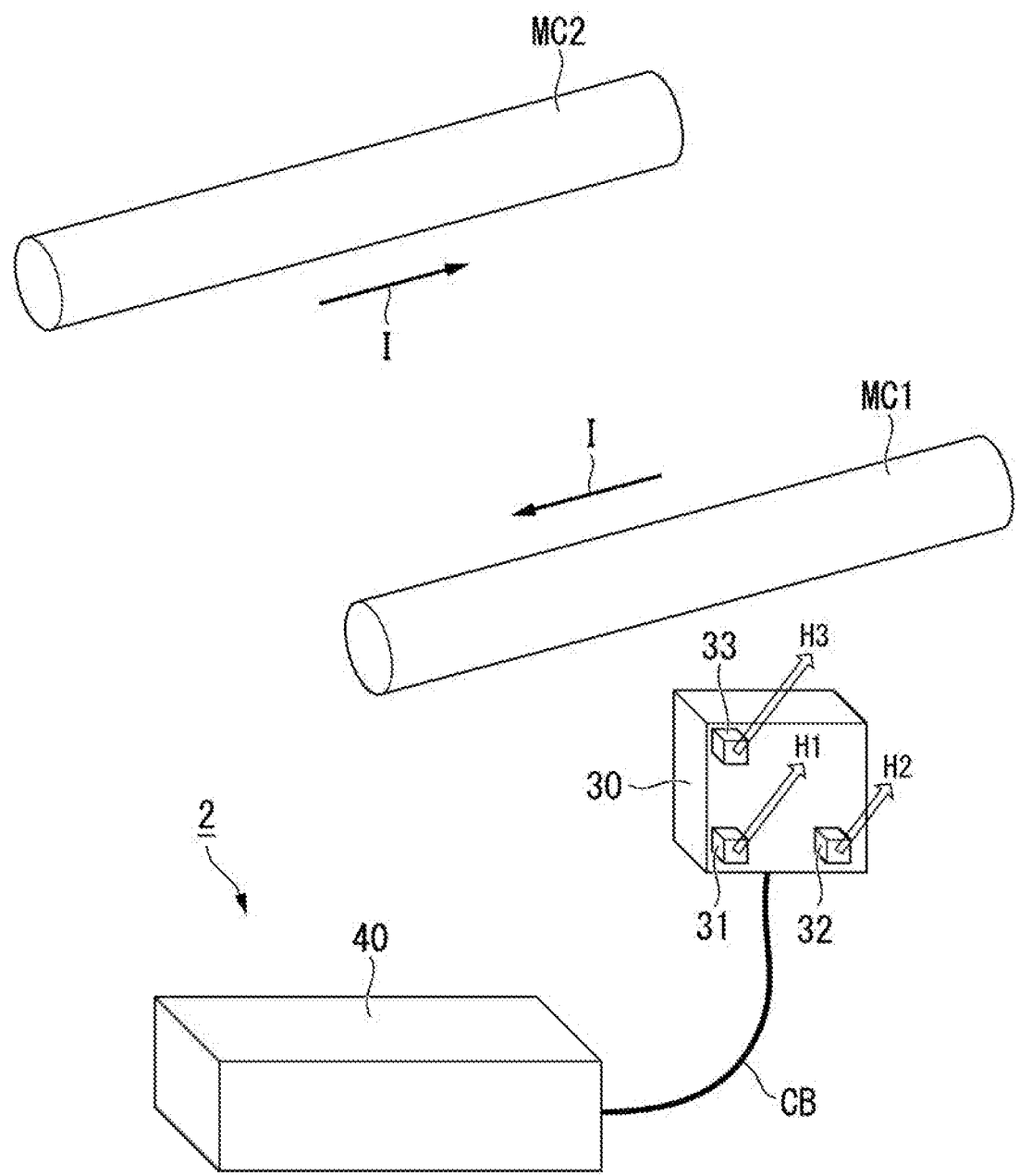
FIG. 7 is a diagram schematically illustrating a current measuring device according to a second embodiment.

FIG. 7 is a diagram schematically illustrating the current measuring device according to the second embodiment. As illustrated in FIG. 7, a current measuring device 2 according to the second embodiment includes a sensor head 30 and a circuit unit 40 which are connected to each other by a cable CB, and directly measures a current I flowing in one of measurement-object conductors MC1 and MC2 in a noncontact manner. In the second embodiment, it is assumed that a current I flowing in the measurement-object conductor MC1 is measured.

The measurement-object conductors MC1 and MC2 are arbitrary conductors such as a pin of a power semiconductor or a bus bar. In the following description, for the purpose of simplification of description, the measurement-object conductors MC1 and MC2 are assumed to be conductors of a cylindrical shape. Currents I flowing in the measurement-object conductors MC1 and MC2 are opposite to each other in direction thereof. In the following description, a current path of a current flowing in the measurement-object conductor MC1 may be referred to as an "outward path" and a current path of a current flowing in the measurement-object conductor MC2 may be referred to as a "return path."

The sensor head 30 is a member that is disposed in an arbitrary posture at an arbitrary position relative to the measurement-object conductor MC1 in order to measure a current I flowing in the measurement-object conductor MC1 in a noncontact manner. The sensor head 30 is formed of a material (such as a resin) which does not intercept magnetic fields which are generated by the current I (for example, magnetic fields H1, H2, and H3 in FIG. 7) flowing in the measurement-object conductors MC1 and MC2. In other words, the sensor head 30 is used as a probe for measuring the current I flowing in the measurement-object conductor MC1 in a noncontact manner.

Three triaxial magnetic sensors 31, 32, and 33 are provided in the sensor head 30. The triaxial magnetic sensors 31, 32, and 33 are magnetic sensors having magnetic-sensing directions in three axes which are perpendicular to each other. The triaxial magnetic sensors 31, 32, and 33 are arranged with a prescribed positional relationship such that the magnetic-sensing directions of the triaxial magnetic sensors 31, 32, and 33 are parallel to each other. For example, the triaxial magnetic sensors 31, 32, and 33 are arranged apart from each other by a predetermined distance in a predetermined direction such that first axes of the triaxial magnetic sensors 31, 32, and 33 are parallel to each other, second axes of the triaxial magnetic sensors 31, 32, and 33 are parallel to each other, third axes of the triaxial magnetic sensors 31, 32, and 33 are parallel to each other. In the following description, it is assumed that the triaxial magnetic sensors 31 and 32 are arranged apart a predetermined distance in the first axis direction and the triaxial magnetic sensors 31 and 33 are arranged apart a predetermined distance in the third axis direction.

Signals indicating the detection results from the triaxial magnetic sensors 31, 32, and 33 may be any of analog signals and digital signals. When the signals indicating the detection results from the triaxial magnetic sensors 31, 32, and 33 are digital signals, the number of cables CB connecting the sensor head 30 and the circuit unit 40 can be decreased. For example, when the signals indicating the detection results from the triaxial magnetic sensors 31, 32, and 33 are analog signals, three cables CB for outputting the detection results of three axes from the triaxial magnetic sensors 11 and 12 are required and thus a total of nine cables CB are required. However, when the signals indicating the detection results from the triaxial magnetic sensors 31, 32, and 33 are digital signals, only one cable CB is required. When the number of cables CB is small, flexibility of the cables CB is improved and thus the cables can be easily handled, for example, when the sensor head 30 is provided in a small space.

The circuit unit 40 measures a current I flowing in the measurement-object conductor MC1 based on the detection results (the detection results from the triaxial magnetic sensors 31, 32, and 33) output from the sensor head 30. Here the circuit unit 40 excludes an influence of a magnetic field which is generated by the current I flowing in the measurement-object conductor MC2 and measures the current I flowing in the measurement-object conductor MC1. The circuit unit 40 displays the results of measurement of the current I or outputs the results of measurement to the outside. An arbitrary cable can be used as the cable CB connecting the sensor head 30 and the circuit unit 40, and a cable having flexibility, easiness in handling, and difficulty in disconnection can be preferably employed.

Figure 8:
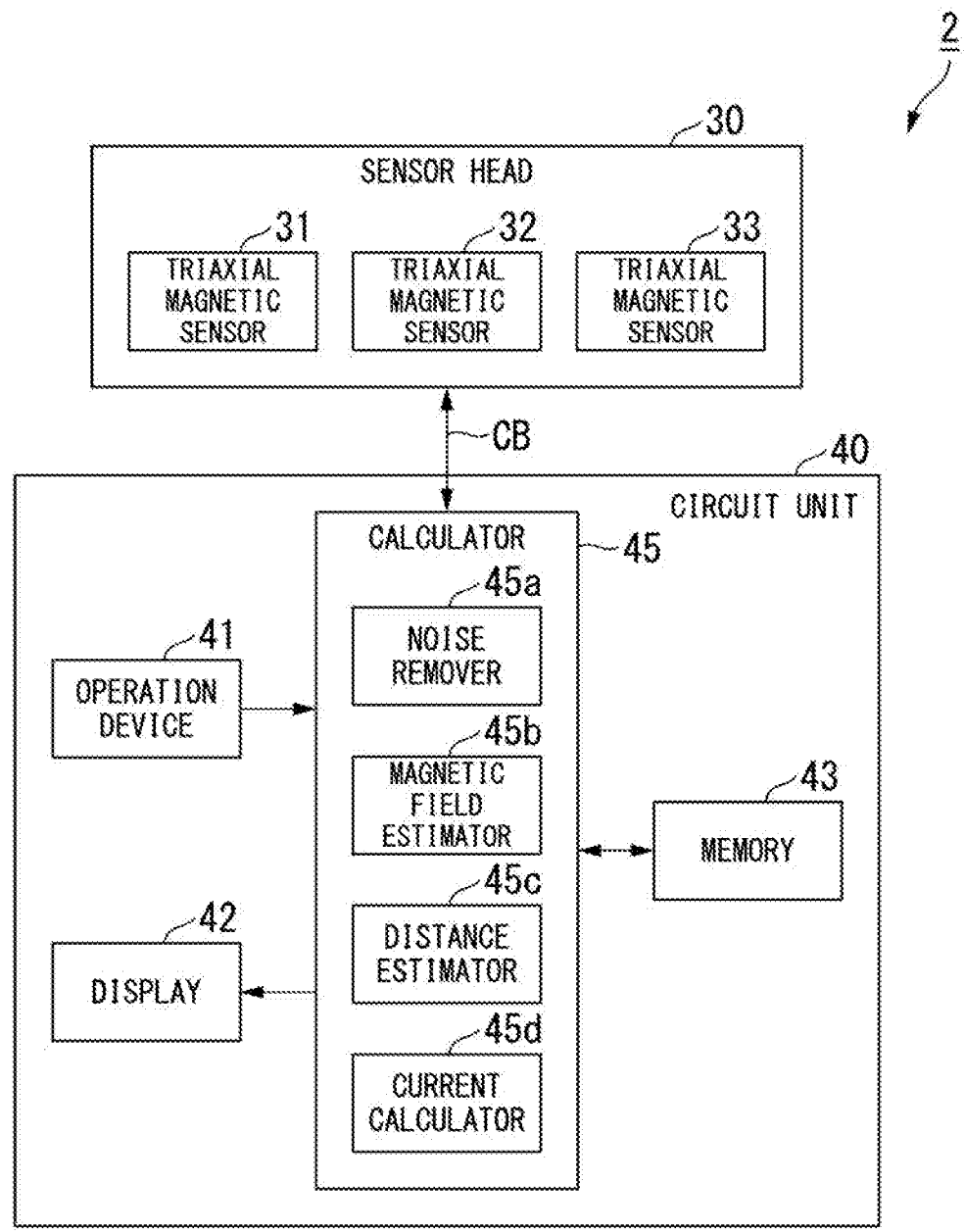
FIG. 8 is a block diagram illustrating a configuration of a principal part of the current measuring device according to the second embodiment.

FIG. 8 is a block diagram illustrating a configuration of a principal part of the current measuring device according to the second embodiment. In FIG. 8, blocks corresponding to the configuration illustrated in FIG. 7 will be referred to by the same reference signs. Details of the inner configuration of the circuit unit 40 will be mainly described below with reference to FIG. 8. As illustrated in FIG. 8, the circuit unit 40 includes an operation device 41, a display 42, a memory 43, and a calculator 45.

The operation device 41 includes various buttons such as a power supply button and a setting button and outputs signals indicating operation instructions for the buttons to the calculator 45. The display 42 includes a display device such as a 7-segment light emitting diode (LED) indicator or a liquid crystal display device and displays various types of information (for example, information indicating the result of measurement of the current I flowing in the measurement-object conductor MC1) output from the calculator 45. The operation device 41 and the display 42 may be physically separated from each other or may be physically integrated like a touch panel type liquid crystal display device having both a display function and an operation function.

The memory 43 includes, for example, a volatile or nonvolatile semiconductor memory and stores the detection results from the triaxial magnetic sensors 31, 32, and 33 output from the sensor head 30, the results of calculation from the calculator 45 (the result of measurement of the current I flowing in the measurement-object conductor MC1), and the like. The memory 43 may include an auxiliary storage device such as a hard disk drive (HDD) or a solid state drive (SSD) in addition to the semiconductor memory (or instead of the semiconductor memory).

The calculator 45 is realized, for example, by causing a hardware processor such as a central processing unit (CPU) to execute a program (software). Some or all of elements of the calculator 45 may be realized in hardware such as a large scale integration (LSI), an application-specific integrated circuit (ASIC), or a field-programmable gate array (FPGA) or may be realized in cooperation of software and hardware. The calculator 45 stores the detection results from the triaxial magnetic sensors 31, 32, and 33 output from the sensor head 30 in the memory 43. The calculator 45 reads the detection results from the triaxial magnetic sensors 31, 32, and 33 stored in the memory 43 and performs an operation of calculating the current I flowing in the measurement-object conductor MC1. The calculator 45 includes a noise remover 45a, a magnetic field estimator 45b, a distance estimator 45c, and a current calculator 45d.

The noise remover 45a removes noise components included in the detection results from the triaxial magnetic sensors 31, 32, and 33. Specifically, the noise remover 45a removes noise components included in the detection results from the triaxial magnetic sensors 31, 32, and 33 by individually performing an averaging process or a square root of a sum of squares calculating process on a plurality of detection results acquired from the triaxial magnetic sensors 31, 32, and 33 at prescribed constant time intervals (for example, 1 second). The detection results of three axes are output from the triaxial magnetic sensors 31, 32, and 33, and removal of noise components by the noise remover 45a is individually performed on the detection result of each axis. This removal of noise is for improving a signal-to-noise (SN) ratio of the triaxial magnetic sensors 31, 32, and 33 and enhancing measurement accuracy of the current I.

The magnetic field estimator 45b estimates a magnetic field which is generated by a current flowing in the measurement-object conductor MC2 based on the detection results from the triaxial magnetic sensors 31, 32, and 33 and the positional relationship between the triaxial magnetic sensors 31, 32, and 33. This estimation is for excluding an influence of the magnetic field which is generated by the current I flowing in the measurement-object conductor MC2 and enhancing the measurement accuracy of the current I flowing in the measurement-object conductor MC1. The magnetic field which is estimated by the magnetic field estimator 45b is a magnetic field when the magnetic field which is generated by the current I flowing in the measurement-object conductor MC2 is considered to act approximately uniformly on the triaxial magnetic sensors 31, 32, and 33. This uniform magnetic field is considered to achieve a decrease in calculation load and a decrease in calculation time of the magnetic field estimator 45b and to enhance the measurement accuracy as much as possible. Details of the process which is performed by the magnetic field estimator 45b will be described later.

The distance estimator 45c estimates a distance of at least one of the triaxial magnetic sensors 31, 32, and 33 with respect to the measurement-object conductor MC1 based on the detection results from the triaxial magnetic sensors 31, 32, and 33 and the positional relationship between the triaxial magnetic sensors 31, 32, and 33. This estimation of a distance is for measuring the current I flowing in the measurement-object conductor MC1. Details of the process which is performed by the distance estimator 45c will be described later.

The current calculator 45d calculates the current I flowing in the measurement-object conductor MC1 based on the distance estimated by the distance estimator 45c and the detection results from the triaxial magnetic sensors 31, 32, and 33 from which the influence of the magnetic field generated by the current I flowing in the measurement-object conductor MC2 has been excluded. For example, when the distance of the triaxial magnetic sensor 31 with respect to the measurement-object conductor MC1 is estimated by the current calculator 45d, the current calculator 45d calculates the current I flowing in the measurement-object conductor MC1 based on the estimated distance of the triaxial magnetic sensor 31 with respect to the measurement-object conductor MC1 and a value obtained by subtracting the magnetic field estimated by the magnetic field estimator 45b from the result of the detection from the triaxial magnetic sensor 31. Details of the process which is performed by the current calculator 45d will be described later.

As illustrated in FIGS. 7 and 8, the circuit unit 40 is separated from the sensor head 30 and is connected to the sensor head 10 via the cable CB. By employing this configuration, a magnetic field detecting function (the triaxial magnetic sensors 31, 32, and 33) and a calculation function (the calculator 45) can be separated from each other, various problems (for example, temperature characteristics and insulation resistance) which occur when the calculator 45 is provided in the sensor head 30 can be avoided, and thus the usage of the current measuring device 2 can be expanded.

<Principle of Measuring Current>

Figure 9:
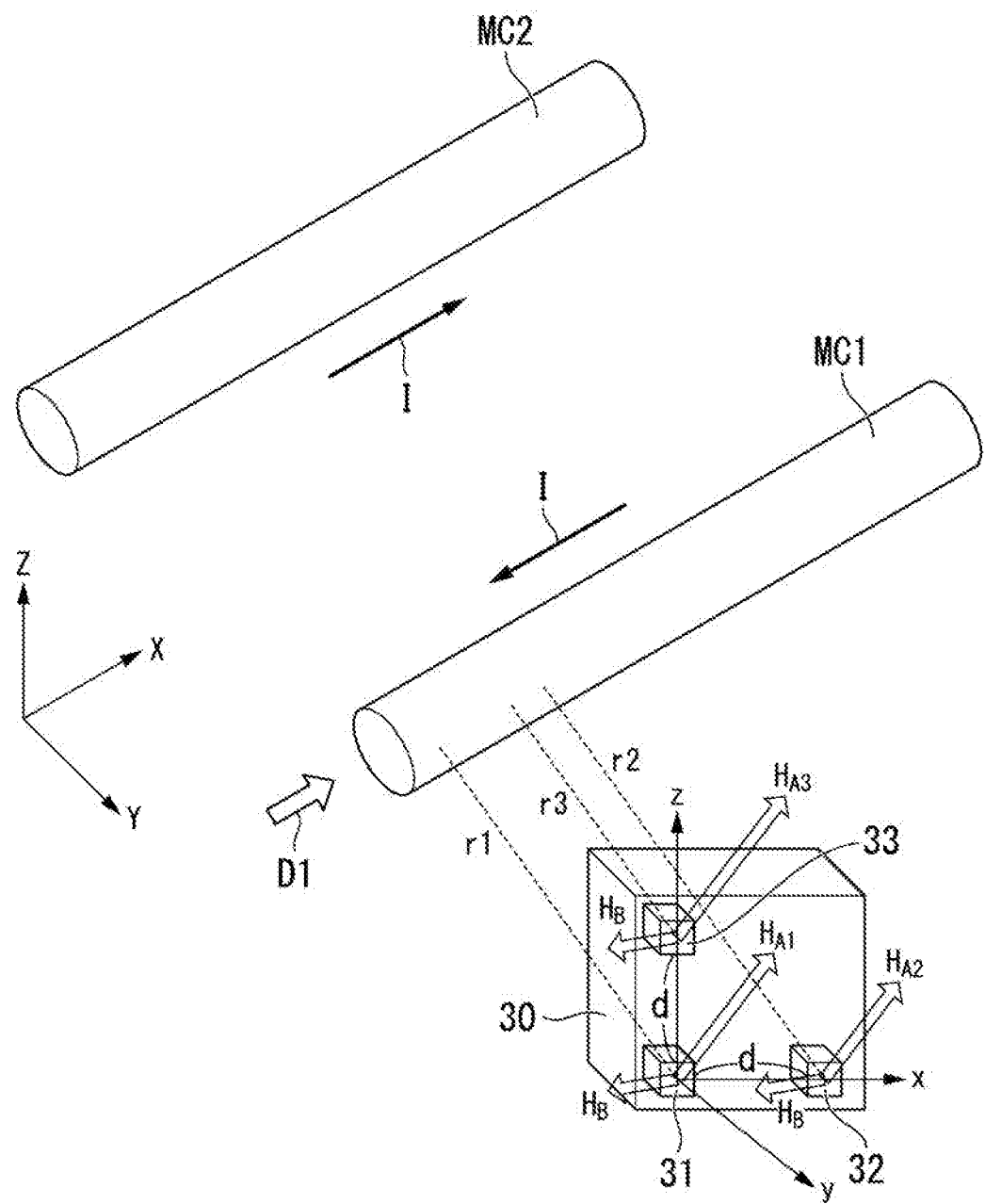
FIG. 9 is a diagram illustrating the principle of measuring a current using the current measuring device according to the second embodiment.

The principle of measuring a current in the current measuring device 2 will be described below. FIG. 9 is a diagram illustrating the principle of measuring a current using the current measuring device according to the second embodiment. First, as illustrated in FIG. 9, two coordinate systems including a coordinate system (an xyz orthogonal coordinate system) associated with only the sensor head 30 and a coordinate system (an XYZ orthogonal coordinate system) associated with measurement-object conductors MC1 and MC2 are set.

The xyz orthogonal coordinate system is a coordinate system which is defined depending on the position and posture of the sensor head 30. In the xyz orthogonal coordinate system, the origin is set to the position of the triaxial magnetic sensor 31, the x axis is set to the first axis direction of the triaxial magnetic sensors 31, 32, and 33 (the arrangement direction of the triaxial magnetic sensors 31 and 32), the y axis is set to the second axis direction of the triaxial magnetic sensors 31, 32, and 33, and the z axis is set to the third axis direction of the triaxial magnetic sensors 31, 32, and 33 (the arrangement direction of the triaxial magnetic sensors 31 and 33).

Here, the positions of the triaxial magnetic sensors 31, 32, and 33 are defined as Pi (where i=1, 2, 3). Pi is a vector. That is, it is assumed that the position of the triaxial magnetic sensor 31 is defined as P1, the position of the triaxial magnetic sensor 32 is defined as P2, and the position of the triaxial magnetic sensor 33 is defined as P3. For example, when the gap in the x direction between the triaxial magnetic sensors 31 and 32 and the gap in the z direction between the triaxial magnetic sensors 31 and 33 are d [m] as illustrated in FIG. 9, the positions of the triaxial magnetic sensors 31, 32, and 33 are expressed as follows.

The position of the triaxial magnetic sensor 31: P1=(0, 0, 0)

The position of the triaxial magnetic sensor 32: P2=(d, 0, 0)

The position of the triaxial magnetic sensor 33: P3=(0, 0, d)

The XYZ orthogonal coordinate system is a coordinate system which is defined depending on measurement-object conductors MC1 and MC2. In the XYZ orthogonal coordinate system, the X axis is set to be parallel to the length direction of the measurement-object conductors MC1 and MC2 (the direction of the current I) and the Y axis is set to be parallel to the arrangement direction of the measurement-object conductors MC1 and MC2. The Z axis is set to be perpendicular to the X axis and the Y axis. The position of the origin of the XYZ orthogonal coordinate system can be set to an arbitrary position.

As illustrated in FIG. 9, a distance of the triaxial magnetic sensor 31 with respect to the measurement-object conductor MC1 is defined as r1, a distance of the triaxial magnetic sensor 32 with respect to the measurement-object conductor MC1 is defined as r2, and a distance of the triaxial magnetic sensor 33 with respect to the measurement-object conductor MC1 is defined as r3. The distance r1 is a length of a segment which is drawn perpendicularly from the triaxial magnetic sensor 31 to the measurement-object conductor MC1, the distance r2 is a length of a segment which is drawn perpendicularly from the triaxial magnetic sensor 32 to the measurement-object conductor MC1, and the distance r3 is a length of a segment which is drawn perpendicularly from the triaxial magnetic sensor 33 to the measurement-object conductor MC1. The distances r1, r2, and r3 cannot be detected.

Magnetic fields which are generated at the positions of the triaxial magnetic sensors 31, 32, and 33 by the current I flowing in the measurement-object conductor MC1 are defined as $H_{Ai}$ (where i=1, 2, 3). $H_{Ai}$ is a vector. That is, the magnetic field which is generated at the position of the triaxial magnetic sensor 31 by the current I flowing in the measurement-object conductor MC1 is defined as $H_{A1}$, the magnetic field which is generated at the position of the triaxial magnetic sensor 32 by the current I flowing in the measurement-object conductor MC1 is defined as $H_{A2}$, and the magnetic field which is generated at the position of the triaxial magnetic sensor 33 by the current I flowing in the measurement-object conductor MC1 is defined as $H_{A3}$.

When the distance of the sensor head 30 with respect to the measurement-object conductor MC2 is sufficiently larger than the distance of the sensor head 30 with respect to the measurement-object conductor MC1, the magnetic field which is generated by the current I flowing in the measurement-object conductor MC2 can be considered to act approximately uniformly on the triaxial magnetic sensors 31, 32, and 33. This magnetic field is defined as $H_B$. $H_B$ is a vector. Magnetic fields Hi (where i=1, 2, 3) which are generated at the positions of the triaxial magnetic sensors 31, 32, and 33 by the currents I flowing in the measurement-object conductors MC1 and MC2 are expressed by Expression (10). Hi is a vector.

[Math. 10]

$$Hi = H_{Ai} + H_B \quad (10)$$

Then, the direction of the current I (the direction of the X axis in FIG. 9) is acquired to correlate the xyz orthogonal coordinate system associated with only the sensor head 30 and the XYZ orthogonal coordinate system associated with the measurement-object conductors MC1 and MC2 with each other. As described above, since the magnetic field $H_B$ which is generated by the current I flowing in the measurement-object conductor MC2 is approximately uniform, the magnetic field HB can be cancelled out by taking differences between the detection results from the triaxial magnetic sensors 31, 32, and 33. Since the direction of the current I is perpendicular to the direction of the magnetic field, a direction of an outer product of the differences between the detection results from the triaxial magnetic sensors 31, 32, and 33 is aligned with the direction of the current I. Accordingly, a unit vector j in the direction of the current I (the direction of the X axis in FIG. 9) is expressed by Expression (11) using the detection results from the triaxial magnetic sensors 31, 32, and 33 (the magnetic fields H1, H2, and H3).

[Math. 11]

$$j = \frac{(H3 - H1) \times (H2 - H1)}{\|(H3 - H1) \times (H2 - H1)\|} \quad (11)$$

Figure 10:
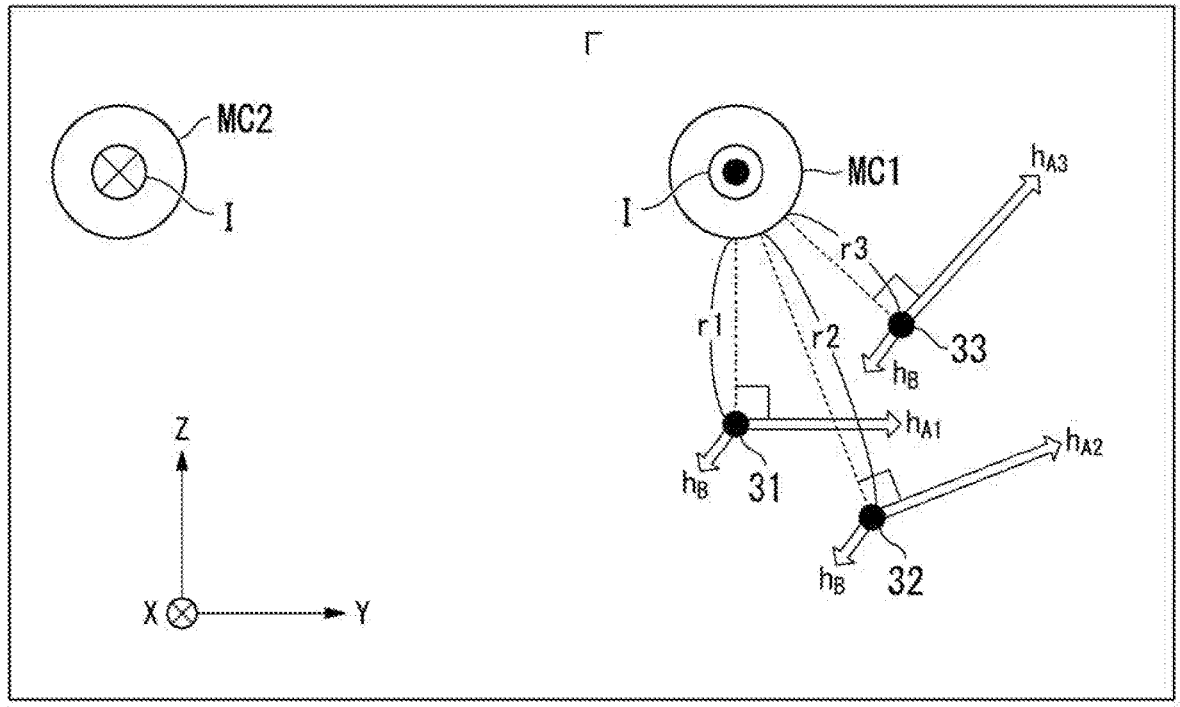
FIG. 10 is a diagram illustrating a measurement-object conductor and triaxial magnetic sensors in the second embodiment when seen from a direction D1 in FIG. 9.

Subsequently, in order to express various vectors in the xyz orthogonal coordinate system as vectors in the XYZ orthogonal coordinate system, a plane Γ which is perpendicular to the current I is considered as illustrated in FIG. 10. That is, a plane Γ which is perpendicular to a unit vector j which is calculated by Expression (11) is considered. The plane Γ may be considered as being a plane parallel to the YZ plane. FIG. 10 is a diagram illustrating the measurement-object conductors and the triaxial magnetic sensors when seen in a direction D1 in FIG. 9. The direction D1 in FIG. 9 is a direction (a direction antiparallel to a direction in which the current I flows in the measurement-object conductor MC1 and a direction parallel to the direction of the current I flowing in the measurement-object conductor MC2) which is parallel to the length direction of the measurement-object conductors MC1 and MC2. In FIG. 10, for the purpose of easy understanding, the sensor head 30 is not illustrated and the measurement-object conductors MC1 and MC2 and the triaxial magnetic sensors 31, 32, and 33 are illustrated.

By projecting the measurement-object conductors MC1 and MC2, the triaxial magnetic sensors 31, 32, and 33, and the magnetic fields which are generated at the positions of the triaxial magnetic sensors 31, 32, and 33 onto the plane Γ in FIG. 10, various vectors expressed in the xyz orthogonal coordinate system can be expressed in the XYZ orthogonal coordinate system. As illustrated In FIG. 10, the magnetic fields which are generated at the positions of the triaxial magnetic sensors 31, 32, and 33 by the current I flowing in the X direction (±X direction) perpendicular to the drawing surface are perpendicular to the X axis. Accordingly, the magnetic fields which are generated at the positions of the triaxial magnetic sensors 31, 32, and 33 can be projected onto the plane Γ perpendicular to the direction in which the current I flows without changing the magnitudes.

Here, the positions of the triaxial magnetic sensors 31, 32, and 33 on the plane Γ are defined as pi (where i=1, 2, 3) and the position of the measurement-object conductor MC1 on the plane Γ is defined as $p_A$. Here, hi and $p_A$ are two-dimensional vectors. The magnetic field hi (where i=1, 2, 3) projected onto the plane Γ is expressed by Expression (12). $h_{Ai}$ and $h_B$ in Expression (12) refer to projection of $H_{Ai}$ and $H_B$ in Expression (10) onto the plane Γ. Here, hi is also a two-dimensional vector.

[Math. 12]

$$hi = h_{Ai} + h_B \quad (12)$$

Subsequently, the magnetic field $H_B$ which is generated by the current I flowing in the measurement-object conductor MC2 is estimated. First, as illustrated in FIG. 10, on the plane Γ, the magnetic field $h_{A1}$ is perpendicular to the segment which is drawn perpendicularly from the triaxial magnetic sensor 31 to the measurement-object conductor MC1. On the plane Γ, the magnetic field $h_{A2}$ is perpendicular to the segment which is drawn perpendicularly from the triaxial magnetic sensor 32 to the measurement-object conductor MC1. Similarly, on the plane Γ, the magnetic field $h_{A3}$ is perpendicular to the segment which is drawn perpendicularly from the triaxial magnetic sensor 33 to the measurement-object conductor MC1. Accordingly, since the inner product between the vectors indicating the segments and the magnetic fields $h_{A1}$, $h_{A2}$, and $h_{A3}$ is zero, Expression (13) is satisfied.

[Math. 13]

$$(hi - h_B)^T (pi - p_A) = 0 \quad (i=1,2,3) \quad (13)$$

Then, paying attention to the relationship between the lengths of the segments and the magnitudes of the magnetic fields $h_{A1}$, $h_{A2}$, and $h_{A3}$, Expression (14) is satisfied based on Ampere's law.

[Math. 14]

$$\|h_i - h_B\| \cdot \|p_i - p_A\| = \frac{I}{2\pi} \quad (i = 1, 2, 3) \tag{14}$$

As described above, the inner product between the vectors indicating the segments which are drawn perpendicularly from the triaxial magnetic sensors 31, 32, and 33 to the measurement-object conductor MC1 and the magnetic fields $h_{A1}$, $h_{A2}$, and $h_{A3}$ is zero. On the other hand, by rotating the vectors indicating the segments by 90° in the plane Γ and then taking the inner product with the magnetic fields $h_{A1}$, $h_{A2}$, and $h_{A3}$, Expression (15) is satisfied.

[Math. 15]

$$(hi - h_B)^T R (pi - p_A) = \frac{I}{2\pi} \quad (i = 1, 2, 3) \tag{15}$$

Here, R in Expression (15) denotes a 90° rotating matrix in a two-dimensional coordinate plane and is represented by Expression (16).

[Math. 16]

$$R = \begin{pmatrix} 0 & -1 \\ 1 & 0 \end{pmatrix} \tag{16}$$

The magnetic field $h_B$ obtained by projection onto the plane Γ is calculated by Expression (17) which is acquired using Expressions (13) and (15).

[Math. 17]

$$h_B = (R^T h^{-1} p R^T - h^{-1} p)^{-1} (R^T h^{-1} c_2 - h^{-1} c_1) \tag{17}$$

Here, p, h, $c_1$, and $c_2$ in Expression (17) are represented by Expression (18).

[Math. 18]

$$p = \begin{pmatrix} p2^T - p1^T \\ p3^T - p1^T \end{pmatrix}, h = \begin{pmatrix} h2^T - h1^T \\ h3^T - h1^T \end{pmatrix}$$

$$c_1 = \begin{pmatrix} h2^T p2 - h1^T p1 \\ h3^T p3 - h1^T p1 \end{pmatrix}, c_2 = \begin{pmatrix} h2^T R p2 - h1^T R p1 \\ h3^T R p3 - h1^T R p1 \end{pmatrix} \tag{18}$$

Here, an X component (a component in the direction in which the current I flows) of the magnetic field $h_B$ acquired by projecting the magnetic field $H_B$ which is generated by the current I flowing in the measurement-object conductor MC2 is lost. Since the magnetic field $H_A$ which is generated by the current I flowing in the measurement-object conductor MC1 does not have an X component, the X components of the magnetic field Hi which are generated by the currents I flowing in the measurement-object conductors MC1 and MC2 are equivalent to the X component of the magnetic field $H_B$. Accordingly, the magnetic field $H_B$ can be calculated by adding the X component ($j^T H_i$) of the magnetic field Hi to the magnetic field $h_B$. In this way, the magnetic field $H_B$ which is generated by the current I flowing in the measurement-object conductor MC2 can be estimated.

Subsequently, the position $p_A$ of the measurement-object conductor MC1 on the plane Γ is calculated. The position $p_A$ of the measurement-object conductor MC1 is calculated by Expression (19) which is acquired using Expressions (13), (15), and (17).

[Math. 19]

$$p_A = -h^{-1} p h_B + h^{-1} c_1 \tag{19}$$

When the position $p_A$ of the measurement-object conductor MC1 on the plane r is known, the distances r1, r2, and r3 of the triaxial magnetic sensors 31, 32, and 33 with respect to the measurement-object conductor MC1 can be calculated (estimated). When the distance r1, r2, and r3 can be calculated (estimated), the current I can be measured based on Ampere's law using one of combinations described below.

Combination of the distance r1 and the detection result from the triaxial magnetic sensor 31 (the magnetic field H1)

Combination of the distance r2 and the detection result from the triaxial magnetic sensor 32 (the magnetic field H2)

Combination of the distance r3 and the detection result from the triaxial magnetic sensor 33 (the magnetic field H3)

Specifically, first, the magnetic field $H_{Ai}$ which is generated at the positions of the triaxial magnetic sensors 31, 32, and 33 by the current I flowing in the measurement-object conductor MC1 are calculated by subtracting the magnetic field H estimated by Expression (17) or the like from the detection results from the triaxial magnetic sensors 31, 32, and 33 (the magnetic fields Hi). Then, the distances r1, r2, and r3 of the triaxial magnetic sensors 31, 32, and 33 with respect to the measurement-object conductor MC1 are calculated using Expression (18) or the like. Accordingly, the current I flowing in the measurement-object conductor MC1 is calculated using Expression (20).

[Math. 20]

$$I = 2\pi r_i \|H_{Ai}\| \tag{20}$$

<Operation of Current Measuring Device>

An operation when the current I flowing in the measurement-object conductor MC1 (the outward path) is measured using the current measuring device 2 will be described below. First, a user of the current measuring device 2 disposes the sensor head 30 close to the measurement-object conductor MC1 in order to measure the current I flowing in the measurement-object conductor MC1. The position and the posture of the sensor head 30 with respect to the measurement-object conductor MC are arbitrary. The sensor head 30 needs to be disposed close to the measurement-object conductor MC1 such that the distance of the sensor head 30 with respect to the measurement-object conductor MC2 can be considered as being sufficiently larger than the distance of the sensor head 30 with respect to the measurement-object conductor MC1. When the measurement-object conductor MC2 is movable, the measurement-object conductor MC2 is disposed distant from the measurement-object conductor MC1 such that the distance of the sensor head 30 with respect to the measurement-object conductor MC2 can be considered as being sufficiently larger than the distance of the sensor head 30 with respect to the measurement-object conductor MC1.

Figure 11:
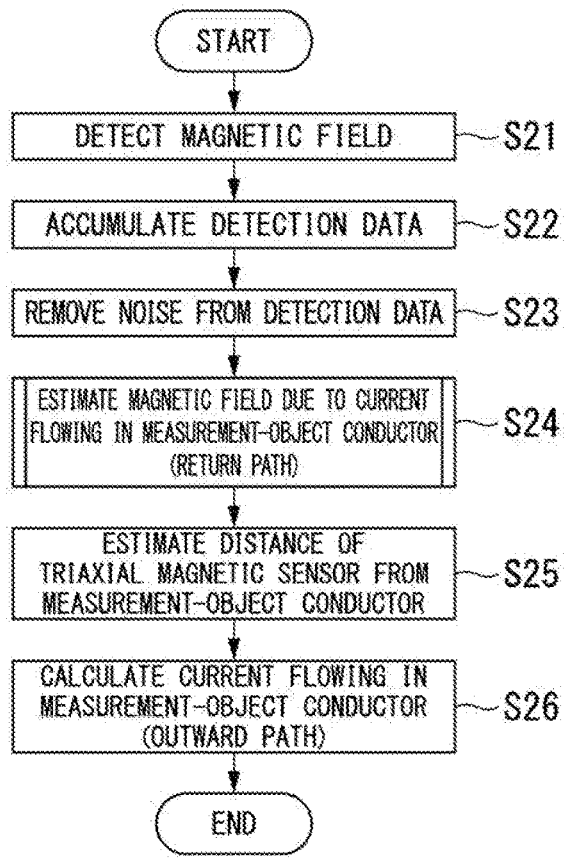
FIG. 11 is a flowchart illustrating a flow of operations of the current measuring device according to the second embodiment.

FIG. 11 is a flowchart illustrating the outline of the operation of the current measuring device according to the second embodiment. The flowchart illustrated in FIG. 11 is started, for example, at constant time intervals (for example, 1 second). When the process flow of the flowchart illustrated in FIG. 11 is started, the triaxial magnetic sensors 31, 32, and 33 detects magnetic fields which are formed by the currents I flowing in the measurement-object conductors MC1 and MC2 (Step S21). The triaxial magnetic sensors 31, 32, and 33 detect the magnetic fields, for example, 1000 times per second. Then, the calculator 45 of the circuit unit 40 accumulates detection data indicating the detection results from the triaxial magnetic sensors 31, 32, and 33 in the memory 43 (Step S22).

Subsequently, the noise remover 45a removes noise components from the detection data (Step S23). Specifically, the noise remover 45a removes the noise components included in the detection data by reading the detection data accumulated in the memory 43 and performing an averaging process or a square root of a sum of squares calculating process on the read detection data. When signs disappear by performing the square root of a sum of squares calculating process, the noise remover 45a separately adds signs to the detection data. Here, each of the triaxial magnetic sensors 31, 32, and 33 outputs three types of detection data indicating the detection results of three axes. The noise remover 45a individually performs the removal of noise components on the detection data of each axis.

Subsequently, the magnetic field estimator 45b estimates a magnetic field $H_B$ which is generated by the current I flowing in the measurement-object conductor MC2 (the return path) (Step S24). The magnetic field $H_B$ which is estimated by the magnetic field estimator 45b is a magnetic field when the magnetic field which is generated by a current flowing in the measurement-object conductor MC2 is considered to act approximately uniformly on three triaxial magnetic sensors 31, 32, and 33.

Figure 12:
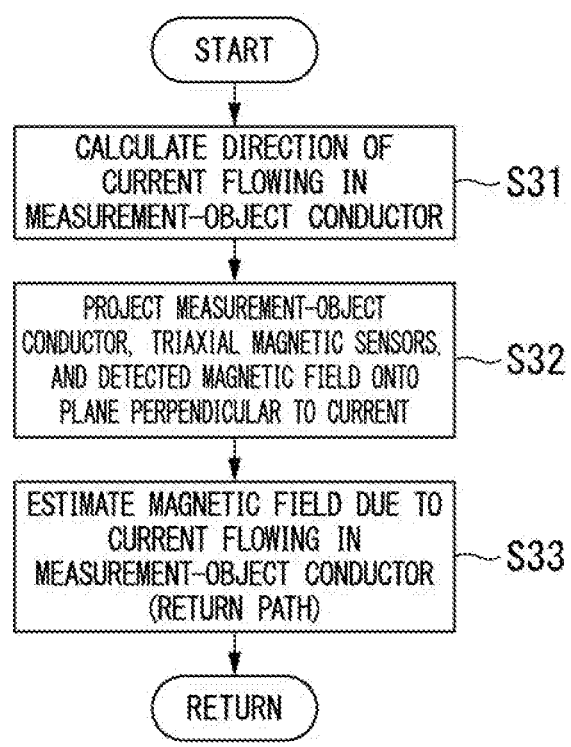
FIG. 12 is a flowchart illustrating details of the process of Step S14 in FIG. 11 in the second embodiment.

FIG. 12 is a flowchart illustrating details of the process of Step S24 in FIG. 11. When the process of Step S24 is started, the magnetic field estimator 45b calculates the directions of the currents I flowing in the measurement-object conductors MC1 and MC2 as illustrated in FIG. 12 (Step S31). Specifically, the magnetic field estimator 45b calculates the directions of the currents I flowing in the measurement-object conductors MC1 and MC2 by performing the calculation indicated by Expression (11) using the detection results from the triaxial magnetic sensors 31, 32, and 33.

Then, the magnetic field estimator 45b projects the measurement-object conductors MC1 and MC2, the triaxial magnetic sensors 31, 32, and 33, and the magnetic fields H1, H2, and H3 detected by the triaxial magnetic sensors 31, 32, and 33 onto the plane Γ perpendicular to the current I (Step S32). Through this process, the magnetic fields h1, h2, and h3 which are obtained by projecting the magnetic fields H1, H2, and H3 onto the plane Γ are expressed by Expression (12).

Then, the magnetic field estimator 45b calculates the magnetic field $H_B$ which is generated by the current I flowing in the measurement-object conductor MC2 (the return path) (Step S33). Specifically, the magnetic field estimator 45b calculates the magnetic field $H_B$ by calculating the magnetic field $h_B$ using Expressions (17) and (18) and adding the X component ($j^T H_i$) of the magnetic fields Hi to the magnetic field $h_B$. Through this process, the magnetic field estimator 45b estimates the magnetic field $H_B$ which is generated by the current I flowing in the measurement-object conductor MC2 (the return path).

Subsequently, the distance estimator 45c estimates the distances r1, r2, and r3 of the triaxial magnetic sensors 31, 32, and 33 with respect to the measurement-object conductor MC1 (Step S25). Specifically, the distance estimator 45c calculates the position $p_A$ of the measurement-object conductor MC1 on the plane Γ by performing the calculation indicated by Expression (19) using the positions pi of the triaxial magnetic sensors 31, 32, and 33 on the plane Γ, the magnetic fields hi projected onto the plane Γ, and the magnetic field $h_B$ calculated by the Expressions (17) and (18). Then, the distance estimator 45c estimates the distances r1, r2, and r3 of the triaxial magnetic sensors 31, 32, and 33 with respect to the measurement-object conductor MC1 based on the position $p_A$ of the measurement-object conductor MC1 on the plane Γ and the positions pi of the triaxial magnetic sensors 31, 32, and 33 on the plane Γ.

When the above processes end, the current calculator 45d calculates the current I flowing in the measurement-object conductor MC1 (the outward path) (Step S26). Specifically, the current calculator 45d calculates the current I flowing in the measurement-object conductor MC1 by performing the calculation indicated by Expression (20) using the detection results from the triaxial magnetic sensors 31, 32, and 33 (the magnetic fields H1, H2, and H3), the magnetic field HR estimated in Step S24, and the distances r1, r2, and r3 estimated in Step S25.

More specifically, the current calculator 45d calculates the magnetic fields $H_{Ai}$ in Expression (20) (the magnetic fields which are generated at the positions of the triaxial magnetic sensors 31, 32, and 33 by the current I flowing in the measurement-object conductor MC1) by subtracting the magnetic field $H_B$ estimated in Step S24 from the detection results from the triaxial magnetic sensors 31, 32, and 33 (the magnetic fields H1, H2, and H3). Then, the current calculator 45d performs the calculation indicated by Expression (20) using the distances r1, r2, and r3 estimated in Step S25 and the magnitudes of the magnetic fields $H_{Ai}$. In this way, the current measuring device 2 excludes an influence of the magnetic field which is generated by the current I flowing in the measurement-object conductor MC2 and then directly measures the current I flowing in the measurement-object conductor MC1 in a noncontact manner.

As described above, the current measuring device 2 according to the second embodiment estimates the magnetic field $H_B$ which is generated by the current I flowing in the measurement-object conductor MC2 and estimates the distances r1, r2, and r3 of the triaxial magnetic sensors 31, 32, and 33 with respect to the measurement-object conductor MC1 using the detection results from the triaxial magnetic sensors 31, 32, and 33 and the positional relationship between the triaxial magnetic sensors 31, 32, and 33. The current measuring device 2 measures the current I flowing in the measurement-object conductor MC1 using the value obtained by excluding the influence of the magnetic field $H_B$ from the detection results from the triaxial magnetic sensors 31, 32, and 33 (the magnetic fields H1, H2, and H3) and the estimated distance r1, r2, and r3. In the second embodiment, the position and the posture of the sensor head 30 with respect to the measurement-object conductor MC1 may be arbitrary. The detection results from the triaxial magnetic sensors 31, 32, and 33 are acquired regardless of whether the current I is a direct current or an alternating current. Accordingly, the current measuring device 2 according to the second embodiment can be flexibly disposed and accurately measure a direct current and an alternating current of a low frequency flowing in one (the measurement-object conductor MC1) of the outward and return current paths in a noncontact manner.

In the second embodiment, the sensor head 30 in which the triaxial magnetic sensors 31, 32, and 33 are provided and the circuit unit 40 in which the calculator 45 is provided are separated from each other and are connected by the cable CB. Accordingly, since the sensor head 30 can be easily handled and the sensor head 30 can be easily installed, for example, in a small place, it is possible to more flexibly dispose the current measuring device 2.

When the current I flowing in the measurement-object conductor MC1 is measured, both the detection results from the triaxial magnetic sensors 31, 32, and 33 (the value obtained by excluding the influence of the magnetic field $H_B$ from the magnetic fields H1, H2, and H3) and the estimated distance r1, r2, and r3 do not have to be used. The current I flowing in the measurement-object conductor MC1 can be measured using one of the following combinations.

Combination of the distance r1 and the detection result from the triaxial magnetic sensor 31
Combination of the distance r2 and the detection result from the triaxial magnetic sensor 32
Combination of the distance r3 and the detection result from the triaxial magnetic sensor 33

While the current measuring device according to the second embodiment of the invention has been described above, the invention is not limited to the second embodiment and can be freely modified within the scope of the invention. For example, in the second embodiment, the current measuring device 2 estimates the distances r1, r2, and r3 of the triaxial magnetic sensors 31, 32, and 33 with respect to the measurement-object conductor MC1 and measures the current I flowing in the measurement-object conductor MC1 using the estimated distances r1, r2, and r3. However, the current measuring device 2 does not have to estimate the distances r1, r2, and r3 of the triaxial magnetic sensors 31, 32, and 33 with respect to the measurement-object conductor MC1 and may omit the estimation.

That is, referring to Expressions (18) and (19), the position $p_A$ of the measurement-object conductor MC1 on the plane Γ is calculated using the positions pi of the triaxial magnetic sensors 31, 32, and 33 on the plane Γ, the magnetic fields hi obtained by projection onto the plane Γ, and the magnetic field $h_B$ calculated by Expressions (17) and (18). Accordingly, the distances ri (r1, r2, and r3) of the triaxial magnetic sensors 31, 32, and 33 with respect to the measurement-object conductor MC1 can also be calculated using the position $p_A$, the positions pi, and the magnetic field $h_B$. Accordingly, by acquiring an expression for calculating the distances ri of the triaxial magnetic sensors 31, 32, and 33 with respect to the measurement-object conductor MC1 in advance and substituting the calculated expression into Expression (20), Expression (20) can be modified to an expression for calculating the current I using the position $p_A$, the positions pi, and the magnitudes of the magnetic field $h_B$ and $H_{Ai}$. Accordingly, the process of estimating the distances ri of the triaxial magnetic sensors 31, 32, and 33 with respect to the measurement-object conductor MC1 can be omitted.

In the second embodiment, the triaxial magnetic sensors 31 and 32 are separated the gap d [m] in the first axis direction (the x axis direction) from each other and the triaxial magnetic sensors 31 and 33 are separated the gap d [m] in the third axis direction (the z axis direction) from each other. However, the relative positional relationship between the triaxial magnetic sensors 31, 32, and 33 is arbitrary as long as the magnetic-sensing directions thereof are set to be parallel to each other.

The above-mentioned various processes in the embodiments may be performed by recording a program for realizing some or all functions constituting the calculators 24 and 45 described above in the embodiments on a computer-readable recording medium and causing a computer system to read and execute the program recorded on the recording medium. The "computer system" mentioned herein may include an operating system (OS) or hardware such as peripherals. The "computer system" includes a homepage providing environment (or a homepage display environment) when a WWW system is used. Examples of the "computer-readable recording medium" include a flexible disk, a magneto-optical disk, a ROM, a rewritable nonvolatile memory such as a flash memory, a portable medium such as a CD-ROM and a storage device such as a hard disk built in the computer system.

The "computer-readable recording medium" may include a medium that holds a program for a predetermined time like a volatile memory (for example, a dynamic random access memory (RAM)) in a computer system serving as a server or a client when a program is transmitted via a network such as the Internet or a communication line such as a telephone circuit. The program may be transmitted from a computer system storing the program in a storage device or the like to another computer system via a transmission medium or carrier waves in the transmission medium. Here, the "transmission medium" for transmitting the program means a medium having a function of transmitting information like a network (a communication network) such as the Internet or a communication circuit (a communication line) such as a telephone circuit. The program may serve to realize a part of the above-mentioned functions. The program may be a so-called differential file (a differential program) which realizes the above-mentioned functions in combination with another program stored in the computer system.

The terms indicating a direction such as "front, rear, up, down, right, left, vertical, horizontal, lengthwise, widthwise, row, and column" in this specification mention such directions in the device according to the invention. Accordingly, these terms in this specification of the invention have to be construed relatively in the device according to the invention.

The term "include" is used to perform the functions of the invention or to represent a configuration, elements, or parts of a device.

Expressions which are described as "means plus function" in the claims include all structures which can be used to perform the functions included in the invention.

The term "unit" is used to represent an element, a unit, hardware, or a part of software which is programmed to perform a desired function. A typical example of hardware is a device or a circuit, but is not limited thereto.

While exemplary embodiments of the invention have been described above, the invention is not limited to the embodiments. The embodiments can be subjected to addition, omission, substitution, and other modification of a constituent. The invention is not limited by the above description and is defined by only the scope of the appended claims.

REFERENCE SIGNS LIST

1 Current measuring device
2 Current measuring device
10 Sensor head

11 Triaxial magnetic sensor
12 Triaxial magnetic sensor
20 Circuit unit
24 Calculator
24a Noise remover
24b Distance estimator
24c Current calculator
30 Sensor head
31 Triaxial magnetic sensor
32 Triaxial magnetic sensor
33 Triaxial magnetic sensor
40 Circuit unit
45 Calculator
45a Noise remover
45b Magnetic field estimator
45c Distance estimator
45d Current calculator
I Current
MC Measurement-object conductor
MC1 Measurement-object conductor
MC2 Measurement-object conductor

The invention claimed is:

1. A current measuring device that measures a current flowing in one of a pair of measurement-object conductors in which currents flow in opposite directions, comprising:
three triaxial magnetic sensors that are arranged with a prescribed positional relationship such that magnetic-sensing directions of the three triaxial magnetic sensors are parallel to each other; and
a calculator configured to exclude an influence of a magnetic field which is generated due to a current flowing in another measurement-object conductor based on detection results from the three triaxial magnetic sensors and the positional relationship between the three triaxial magnetic sensors and to calculate the current flowing in the one of the measurement-object conductors.

2. The current measuring device according to claim 1, wherein the calculator comprises:
a magnetic field estimator configured to estimate a magnetic field which is generated due to a current flowing in the other measurement-object conductor based on the detection results from the three triaxial magnetic sensors and the positional relationship between the three triaxial magnetic sensors;
a distance estimator configured to estimate a distance of at least one of the three triaxial magnetic sensors with respect to the one of the measurement-object conductors based on the detection results from the three triaxial magnetic sensors and the positional relationship between the three triaxial magnetic sensors; and
a current calculator configured to calculate the current flowing in the one of the measurement-object conductors based on the distance estimated by the distance estimator and a value which is obtained by subtracting a magnetic field estimated by the magnetic field estimator from the detection results from the three triaxial magnetic sensors of which the distance is estimated by the distance estimator.

3. The current measuring device according to claim 2, wherein the magnetic field estimated by the magnetic field estimator is a magnetic field when a magnetic field which is generated due to a current flowing in the other measurement-object conductor acts approximately uniformly on the three triaxial magnetic sensors.

4. The current measuring device according to claim 1, wherein the calculator further comprises a noise remover configured to remove noise components included in the detection results from the three triaxial magnetic sensors, and
wherein the calculator is configured to calculate the current flowing in the one of the measurement-object conductors using the detection results from the three triaxial magnetic sensors from which the noise components are removed by the noise remover.

5. The current measuring device according to claim 4, wherein the noise remover is configured to remove the noise components included in the detection results from the three triaxial magnetic sensors by individually performing an averaging process or a square root of a sum of squares calculating process on the detection results from the three triaxial magnetic sensors which are acquired at prescribed constant time intervals.

6. The current measuring device according to claim 1, further comprising:
a sensor head including the three triaxial magnetic sensors; and
a circuit unit including the calculator.

7. The current measuring device according to claim 1, wherein signals indicating the detection results from the three triaxial magnetic sensors are digital signals.

8. A current measuring method that is performed by a current measuring device that comprises three triaxial magnetic sensors and a calculator and measures a current flowing in one of a pair of measurement-object conductors in which currents flow in opposite directions, the one or more programs causing the current measuring device to execute:
excluding, by the calculator, an influence of a magnetic field which is generated due to a current flowing in another measurement-object conductor based on detection results from three triaxial magnetic sensors that are arranged with a prescribed positional relationship such that magnetic-sensing directions of the three triaxial magnetic sensors are parallel to each other and a positional relationship between the three triaxial magnetic sensors and then calculating the current flowing in the one of the measurement-object conductors.

9. The current measuring method according to claim 8, wherein the calculator comprises a magnetic field estimator, a distance estimator, and a current calculator, and
wherein the current measuring method further comprises:
estimating, by the magnetic field estimator, a magnetic field which is generated due to a current flowing in the other measurement-object conductor based on the detection results from the three triaxial magnetic sensors and the positional relationship between the three triaxial magnetic sensors;
estimating, by the distance estimator, a distance of at least one of the three triaxial magnetic sensors with respect to the one of the measurement-object conductors based on the detection results from the three triaxial magnetic sensors and the positional relationship between the three triaxial magnetic sensors; and
calculating, by the current calculator, the current flowing in the one of the measurement-object conductors based on the distance estimated by the distance estimator and a value which is obtained by subtracting a magnetic field estimated by the magnetic field estimator from the detection results from the three triaxial magnetic sensors of which the distance is estimated by the distance estimator.

10. A non-transitory computer-readable storage medium storing one or more programs which are executed by a current measuring device that includes three triaxial magnetic sensors and a calculator and measures a current flowing in one of a pair of measurement-object conductors in which currents flow in opposite directions, the one or more programs causing the current measuring device to execute:
excluding, by the calculator, an influence of a magnetic field which is generated due to a current flowing in the other measurement-object conductor based on detection results from three triaxial magnetic sensors that are arranged with a prescribed positional relationship such that magnetic-sensing directions of the three triaxial magnetic sensors are parallel to each other and a positional relationship between the three triaxial magnetic sensors and then calculating the current flowing in the one of the measurement-object conductors.

* * * * *